(12) United States Patent
Ebata et al.

(10) Patent No.: US 11,462,399 B2
(45) Date of Patent: Oct. 4, 2022

(54) SPUTTERING TARGET, OXIDE SEMICONDUCTOR THIN FILM, AND METHOD FOR PRODUCING OXIDE SEMICONDUCTOR THIN FILM

(71) Applicant: Idemitsu Kosan Co., Ltd., Tokyo (JP)

(72) Inventors: Kazuaki Ebata, Sodegaura (JP); Mami Nishimura, Sodegaura (JP); Nozomi Tajima, Sodegaura (JP)

(73) Assignee: IDEMITSU KOSAN CO., LTD., Tokyo (JP)

(*) Notice: Subject to any disclaimer, the term of this patent is extended or adjusted under 35 U.S.C. 154(b) by 0 days.

(21) Appl. No.: 16/147,424

(22) Filed: Sep. 28, 2018

(65) Prior Publication Data

US 2019/0035626 A1    Jan. 31, 2019

Related U.S. Application Data

(62) Division of application No. 14/414,850, filed as application No. PCT/JP2013/004356 on Jul. 17, 2013, now abandoned.

(30) Foreign Application Priority Data

Jul. 17, 2012 (JP) .................................. 2012-158629
Feb. 27, 2013 (JP) .................................. 2013-036607

(51) Int. Cl.
  *H01L 29/10* (2006.01)
  *H01L 21/02* (2006.01)
  (Continued)

(52) U.S. Cl.
  CPC ........ *H01L 21/02565* (2013.01); *C04B 35/01* (2013.01); *C04B 35/453* (2013.01);
  (Continued)

(58) Field of Classification Search
  CPC ......... H01L 21/02554; H01L 21/02565; H01L 29/66969; H01L 29/7869; H01L 21/02631;
  (Continued)

(56) References Cited

U.S. PATENT DOCUMENTS 5,622,653 A    4/1997  Orita et al.
5,681,671 A    10/1997 Orita et al.
(Continued)

FOREIGN PATENT DOCUMENTS

JP    08-245220 A    9/1996
JP    2007-073312 A  3/2007
(Continued)

OTHER PUBLICATIONS

Final Office Action on U.S. Appl. No. 14/414,850 dated Mar. 5, 2018.
(Continued)

*Primary Examiner* — Jay C Kim
(74) *Attorney, Agent, or Firm* — Foley & Lardner LLP

(57) ABSTRACT

A sputtering target including an oxide that includes an indium element (In), a tin element (Sn), a zinc element (Zn) and an aluminum element (Al), and including a homologous structure compound represented by $InAlO_3(ZnO)_m$ (m is 0.1 to 10), wherein the atomic ratio of the indium element, the tin element, the zinc element and the aluminum element satisfies specific requirements.

12 Claims, 1 Drawing Sheet

(51) Int. Cl.
  *C04B 35/453* (2006.01)
  *C23C 14/08* (2006.01)
  *C23C 14/34* (2006.01)
  *C04B 35/01* (2006.01)
  *H01L 29/786* (2006.01)
  *C23C 14/35* (2006.01)
  *H01L 29/66* (2006.01)

(52) U.S. Cl.
  CPC ............ *C23C 14/08* (2013.01); *C23C 14/086* (2013.01); *C23C 14/3414* (2013.01); *C23C 14/35* (2013.01); *H01L 21/02554* (2013.01); *H01L 21/02631* (2013.01); *H01L 29/66969* (2013.01); *H01L 29/7869* (2013.01); *C04B 2235/3217* (2013.01); *C04B 2235/3284* (2013.01); *C04B 2235/3286* (2013.01); *C04B 2235/3293* (2013.01); *C04B 2235/5445* (2013.01); *C04B 2235/6562* (2013.01); *C04B 2235/6565* (2013.01); *C04B 2235/6567* (2013.01); *C04B 2235/76* (2013.01); *C04B 2235/77* (2013.01); *C04B 2235/81* (2013.01); *C04B 2235/963* (2013.01)

(58) Field of Classification Search
  CPC .................. C04B 35/01; C04B 35/453; C04B 2235/3217; C04B 2235/3284; C04B 2235/3286; C04B 2235/3293; C04B 2235/5445; C04B 2235/6562; C04B 2235/6565; C04B 2235/6567; C04B 2235/76; C04B 2235/77; C04B 2235/81; C04B 2235/963; C23C 14/08; C23C 14/086; C23C 14/3414; C23C 14/35
  See application file for complete search history.

(56) References Cited

U.S. PATENT DOCUMENTS

| | | | |
|---|---|---|---|
| 5,843,341 A | 12/1998 | Orita et al. | |
| 5,942,090 A * | 8/1999 | Ebisawa | C23C 28/3455 204/192.15 |
| 5,955,178 A | 9/1999 | Orita et al. | |
| 5,972,527 A | 10/1999 | Kaijou et al. | |
| 6,878,962 B1 | 4/2005 | Kawasaki et al. | |
| 7,061,014 B2 | 6/2006 | Hosono et al. | |
| 7,145,174 B2 * | 12/2006 | Chiang | H01L 29/7869 257/59 |
| 7,297,977 B2 * | 11/2007 | Hoffman | H01L 29/7869 257/43 |
| 7,427,776 B2 * | 9/2008 | Hoffman | H01L 29/0673 257/59 |
| 7,622,371 B2 * | 11/2009 | Pan | B82Y 10/00 438/500 |
| 7,635,440 B2 | 12/2009 | Hosono et al. | |
| 7,807,515 B2 | 10/2010 | Kato et al. | |
| 7,863,611 B2 * | 1/2011 | Abe | H01L 29/7869 257/56 |
| 8,148,721 B2 * | 4/2012 | Hayashi | H01L 27/1225 257/43 |
| 8,274,078 B2 * | 9/2012 | Itagaki | H01L 29/7869 257/43 |
| 8,304,359 B2 | 11/2012 | Yano et al. | |
| 8,378,391 B2 * | 2/2013 | Koyama | H01L 27/1225 257/225 |
| 8,461,583 B2 * | 6/2013 | Yano | H01L 29/263 438/483 |
| 8,524,123 B2 | 9/2013 | Yano et al. | |
| 8,598,577 B2 | 12/2013 | Park et al. | |
| 8,704,148 B2 | 4/2014 | Jeon et al. | |
| 8,753,491 B2 | 6/2014 | Yamazaki et al. | |
| 8,759,186 B2 * | 6/2014 | Yeh | H01L 29/7869 438/181 |
| 8,835,214 B2 | 9/2014 | Yamazaki | |
| 9,117,713 B2 * | 8/2015 | Koyama | H01L 27/14612 |
| 9,123,360 B2 * | 9/2015 | Saito | C23C 14/3414 |
| 9,136,390 B2 * | 9/2015 | Yamazaki | H01L 27/1225 |
| 9,178,076 B2 * | 11/2015 | Tsuruma | H01L 29/7869 |
| 9,263,471 B2 | 2/2016 | Koyama et al. | |
| 9,268,428 B2 | 2/2016 | Kim et al. | |
| 9,419,610 B2 | 8/2016 | Ahn et al. | |
| 9,520,411 B2 | 12/2016 | Takahashi et al. | |
| 9,575,381 B2 * | 2/2017 | Kurokawa | G02F 1/1354 |
| 9,576,992 B2 | 2/2017 | Jeon et al. | |
| 10,032,930 B2 * | 7/2018 | Hosono | C23C 14/0021 |
| 2005/0039670 A1 | 2/2005 | Hosono et al. | |
| 2007/0194379 A1 | 8/2007 | Hosono et al. | |
| 2009/0114910 A1 * | 5/2009 | Chang | H01L 29/78603 257/43 |
| 2009/0278122 A1 | 11/2009 | Hosono et al. | |
| 2009/0280600 A1 | 11/2009 | Hosono et al. | |
| 2010/0108502 A1 | 5/2010 | Inoue et al. | |
| 2010/0155717 A1 | 6/2010 | Yano et al. | |
| 2011/0006297 A1 | 1/2011 | Inoue et al. | |
| 2011/0101352 A1 | 5/2011 | Hosono et al. | |
| 2011/0163279 A1 * | 7/2011 | Ikisawa | C04B 35/457 204/192.15 |
| 2011/0177696 A1 | 7/2011 | Yano et al. | |
| 2011/0201162 A1 | 8/2011 | Hosono et al. | |
| 2011/0306165 A1 | 12/2011 | Ikisawa et al. | |
| 2012/0012838 A1 | 1/2012 | Hosono et al. | |
| 2012/0286265 A1 * | 11/2012 | Takechi | C23C 14/086 257/43 |
| 2013/0020571 A1 * | 1/2013 | Yamazaki | H01L 29/78618 257/43 |
| 2013/0024082 A1 | 1/2013 | Lee et al. | |
| 2013/0240802 A1 * | 9/2013 | Miki | H01L 21/02554 252/519.15 |

FOREIGN PATENT DOCUMENTS

| | | |
|---|---|---|
| JP | 2008-163441 A | 7/2008 |
| JP | 2008-243928 A | 10/2008 |
| JP | 2011-108873 A | 6/2011 |
| WO | WO-2005/078152 A1 | 8/2005 |
| WO | WO-2005/078153 A1 | 8/2005 |
| WO | WO-2005/088726 A1 | 9/2005 |
| WO | WO-2007/037191 A1 | 4/2007 |
| WO | WO-2009/084537 A1 | 7/2009 |
| WO | WO-2009/142289 A1 | 11/2009 |
| WO | WO-2011/132418 A1 | 10/2011 |
| WO | WO-2012/070676 A1 | 5/2012 |

OTHER PUBLICATIONS

Harvey et al., "Subsolidus Phase Relationships in the ZnO—In2O3—SnO2 System", Journal of American Ceramic Society 91 (2008) pp. 3683-3689.
Hoel et al., "Transparent Conducting Oxides in the ZnO—In2O3—SnO2 System", Chemical Materials 22 (2010) pp. 3569-3579.
International Search Report issued in PCT/JP2013/004356 dated Aug. 27, 2013.
Jood et al., "Al-Doped Zinc Oxide Nanocomposites with Enhanced Thermoelectric Properties", Nano Letters 11 (2011) pp. 4337-4342.
Li et al., "Relation between in ion ordering and crystal structure variation in homologous compounds InMO3(ZnO)m (M=Al and In; m =integer", Micron 31 (2000) pp. 543-550.
Na et al., "Short-Period Superlattice Structure of Sn-Doped In2O3(ZnO)4 and In2O3(ZnO)5 Nanowires", Journal of Physical Chemistry B 109 (2005) pp. 12785-12790.
Naghavi et al., "Influence of tin doping on the structural and physical properties of indium-zinc oxides thin films deposited by pulses laser depostion", Thin Solid Films 419 (2002) pp. 160-165.
Office Action issued in Taiwanese Patent Application No. 102125629 dated Jul. 29, 2016.
Ohta et al., "Thermoelectric Properties of Homologous Compounds in the ZnO—In2O3 System", Journal of American Ceramic Society 79 (1996) pp. 2193-2196.

(56) References Cited

OTHER PUBLICATIONS

Suzuki et al., "Transparent Conducting Al-Doped ZnO Thin Films Prepared by Pulsed Laser Deposition", Japanese Journal of Applied Physics 35 (1996) pp. L56-L59.
Tominaga et al., "Amorphous transparent conductive oxide films of In2O3—ZnO with additional Al2O3 impurities", Journal of Vacuum Science & Technology A 23 (2005) pp. 401-407.
Translation of Written Opinion of the International Searching Authoority issued in PCT/JP2013/004356 dated Aug. 27, 2013.
U.S. Office Action on U.S. Appl. No. 14/414,850 dated Feb. 26, 2016.
U.S. Office Action on U.S. Appl. No. 14/414,850 dated Aug. 28, 2017.
U.S. Office Action on U.S. Appl. No. 14/414,850 dated Aug. 12, 2016.
Walsh et al., "Interplay between Order and Disorder in the High Performance of Amorphous Transparent Conducting Oxides", Chemical Materials 21 (2009) pp. 5119-5124.
Yoshioka et al., "First-principles investigation of R2O3(ZnO)3 (R=Al, Ga, and In) in homologous series of compounds", Journal of Solid State Chemistry 181 (2008) pp. 137-142.

\* cited by examiner

SPUTTERING TARGET, OXIDE SEMICONDUCTOR THIN FILM, AND METHOD FOR PRODUCING OXIDE SEMICONDUCTOR THIN FILM

CROSS-REFERENCE TO RELATED APPLICATIONS

The present application is a divisional of U.S. application Ser. No. 14/414,850, filed Jun. 16, 2015, which is a National Stage application of PCT/JP2013/004356, filed Jul. 17, 2013, which claims priority from Japanese applications JP 2012-158629, filed Jul. 17, 2012, and JP 2013-036607, filed Feb. 27, 2013.

TECHNICAL FIELD

The invention relates to a sputtering target, an oxide semiconductor thin film and a method for producing the same.

BACKGROUND ART

Field effect transistors, such as a thin film transistor (TFT), are widely used as the unit electronic device of a semiconductor memory integrated circuit, a high frequency signal amplification device, a device for a liquid crystal drive, or the like, and they are electronic devices which are currently most widely put into practical use. Among these, with significant improvement in displays in recent years, in various displays such as a liquid crystal display (LCD), an electroluminescence display (EL) and a field emission display (FED), a TFT is frequently used as a switching device which drives a display by applying a driving voltage to a display device.

As a material of a semiconductor layer (channel layer) which is a main component of a field effect transistor, a silicon semiconductor compound is used most widely. Generally, a silicon single crystal is used for the high frequency amplification device, the device for integrated circuits or the like which need high-speed operation. On the other hand, an amorphous silicon semiconductor (amorphous silicon) is used for a device for driving a liquid crystal in order to satisfy the demand for realizing a large-area display.

A thin film of amorphous silicon can be formed at relatively low temperatures. However, the switching speed thereof is slow as compared with that of a crystalline thin film. Therefore, when it is used as a switching device that drives a display, it may be unable to follow the display of a high-speed animation. Specifically, amorphous silicon having a mobility of 0.5 to 1 $cm^2/Vs$ could be used in a liquid crystal television of which the resolution is VGA. However, if the resolution is equal to or more than SXGA, UXGA and QXGA, a mobility of 2 $cm^2/Vs$ or more is required. Moreover, if the driving frequency is increased in order to improve the image quality, a further higher mobility is required.

As for a crystalline silicon-based thin film, although it has a high mobility, there are problems that a large amount of energy and a large number of steps are required for the production, and that large-area film formation is difficult. For example, when a silicon-based thin film is crystallized, a high temperature of 800° C. or more or laser annealing which needs expensive equipment is required. In the case of a crystalline silicon-based thin film, the device configuration of a TFT is normally restricted to a top-gate configuration, and hence, reduction in production cost such as decrease in number of masks is difficult.

In order to solve the problem, a thin film transistor using an oxide semiconductor film formed of indium oxide, zinc oxide and gallium oxide has been studied. In general, an oxide semiconductor thin film is formed by sputtering using a target (sputtering target) composed of an oxide sintered body.

A target formed of a homologous crystal structure compound such as $In_2Ga_2ZnO_7$ and $InGaZnO_4$ is known (Patent Documents 1, 2 and 3). However, in this target, in order to increase the sintering density (relative density), it is required to conduct sintering in an oxidizing atmosphere. In this case, in order to reduce the resistance of the target, a reduction treatment at a high temperature is required to be conducted after sintering. Further, if the target is used for a long period of time, problems arise that the properties of the resulting thin film or the film-forming speed largely change; abnormal discharge due to abnormal growth of $In_2Ga_2ZnO_7$ or $InGaZnO_4$ occurs; particles are frequently generated during film formation or the like. If abnormal discharge occurs frequently, plasma discharge state becomes unstable, and as a result, stable film-formation is not conducted, adversely affecting the film properties.

On the other hand, a thin film transistor that is obtained by using an amorphous oxide semiconductor film that does not contain gallium and is composed of indium oxide and zinc oxide has been proposed (Patent Document 4). However, this thin film transistor has a problem that a normally-off operation of a TFT cannot be realized as long as the oxygen partial pressure at the time of film formation is increased.

Further, studies have been made on a sputtering target for forming a protective layer of an optical information recording medium, that is obtained by adding an additive element such as Ta, Y, Si or the like to an $In_2O_3$—$SnO_2$—ZnO-based oxide composed mainly of tin oxide (Patent Documents 5 and 6). However, these targets have problems that they are not used for forming an oxide semiconductor, an agglomerate of an insulating material is likely to be formed easily, whereby the resistance is increased or abnormal discharge tends to occur easily.

RELATED ART DOCUMENTS

Patent Documents

Patent Document 1: JP-A-H8-245220
Patent Document 2: JP-A-2007-73312
Patent Document 3: WO2009/084537
Patent Document 4: WO2005/088726
Patent Document 5: WO2005/078152
Patent Document 6: WO2005/078153

SUMMARY OF THE INVENTION

An object of the invention is to provide a high-density and low-resistant sputtering target.

Another object of the invention is to provide a thin film transistor having a high field effect mobility and high reliability.

According to the invention, the following sputtering target or the like are provided.
1. A sputtering target comprising an oxide that comprises an indium element (In), a tin element (Sn), a zinc element (Zn) and an aluminum element (Al), and comprising a homologous structure compound represented by $InAlO_3(ZnO)_m$ (m is 0.1 to 10), wherein the atomic ratio of the indium element, the tin element, the zinc element and the aluminum element satisfies the following formulas (1) to (4):

$$0.10 \leq In/(In+Sn+Zn+Al) \leq 0.60 \quad (1)$$

$$0.01 \leq Sn/(In+Sn+Zn+Al) \leq 0.30 \quad (2)$$

$$0.10 \leq Zn/(In+Sn+Zn+Al) \leq 0.65 \quad (3)$$

$$0.01 \leq Al/(In+Sn+Zn+Al) \leq 0.30 \quad (4)$$

wherein in the formulas, In, Sn, Zn and Al are respectively the substance amount of the indium element, the tin element, the zinc element and the aluminum element in the sputtering target.

2. The sputtering target according to 1, wherein the homologous structure compound represented by $InAlO_3(ZnO)_m$ (m is 0.1 to 10) is one or more selected from a homologous structure compound represented by $InAlZn_2O_5$ and a homologous structure compound represented by $InAlZnO_4$.

3. The sputtering target according to 1 or 2 that comprises a spinel structure compound represented by $Zn_2SnO_4$.

4. The sputtering target according to any one of 1 to 3 that does not comprise a bixbyite structure compound represented by $In_2O_3$.

5. The sputtering target according to any one of 1 to 4 that has a relative density of 98% or more.

6. The sputtering target according to any one of 1 to 5 that has a bulk specific resistance of 5 mΩcm or less.

7. A method for producing a sputtering target, comprising:
a step of elevating a temperature of a formed body of an oxide that comprises an indium element, a tin element, a zinc element and an aluminum element from 800° C. to a sintering temperature at a temperature-elevating rate of 0.1 to 2° C./min, and
retaining the formed body at the sintering temperature for 10 to 50 hours,
wherein the sintering temperature is 1200° C. to 1650° C.

8. An oxide semiconductor thin film obtained by a sputtering method using the sputtering target according to any one of 1 to 6.

9. A method for producing an oxide semiconductor thin film by a sputtering method using the sputtering target according to any one of 1 to 6 in an atmosphere of a mixed gas that comprises: one or more selected from water molecules, oxygen molecules and nitrous oxide molecules; and rare gas atoms.

10. The method for producing an oxide semiconductor thin film according to 9, wherein the mixed gas is a mixed gas that at least comprises rare gas atoms and water molecules.

11. The method for producing an oxide semiconductor thin film according to 10, wherein the ratio of the water molecules contained in the mixed gas is 0.1% to 25% in terms of a partial pressure ratio.

12. The method for producing the oxide semiconductor thin film according to any one of 9 to 11 comprising:
transporting substrates in sequence to positions opposing to 3 or more sputtering targets arranged in parallel with a prescribed interval in a vacuum chamber;
applying a negative potential and a positive potential alternately from an AC power source to each of the targets; and
causing plasma to be generated on the target by applying an output from at least one AC power source between two or more targets divergently connected to this AC power source while switching the target to which a potential is applied, thereby forming a film on a substrate surface.

13. The method for producing the oxide semiconductor thin film according to 12, wherein the AC power density of the AC power source is 3 W/cm² or more and 20 W/cm² or less.

14. The method for producing the oxide semiconductor thin film according to 12 or 13, wherein the frequency of the AC power source is 10 kHz to 1 MHz.

15. A thin film transistor comprising, as a channel layer, the oxide semiconductor thin film formed by the method for producing an oxide semiconductor thin film according to any one of 9 to 14.

16. The thin film transistor according to 15 that has a field effect mobility of 15 cm²/Vs or more.

17. A display comprising the thin film transistor according to 15 or 16.

According to the invention, it is possible to provide a high-density and low-resistant sputtering target.

According to the invention, it is possible to provide a thin film transistor having a high field effect mobility and high reliability.

MODE FOR CARRYING OUT THE INVENTION

Figure 1:
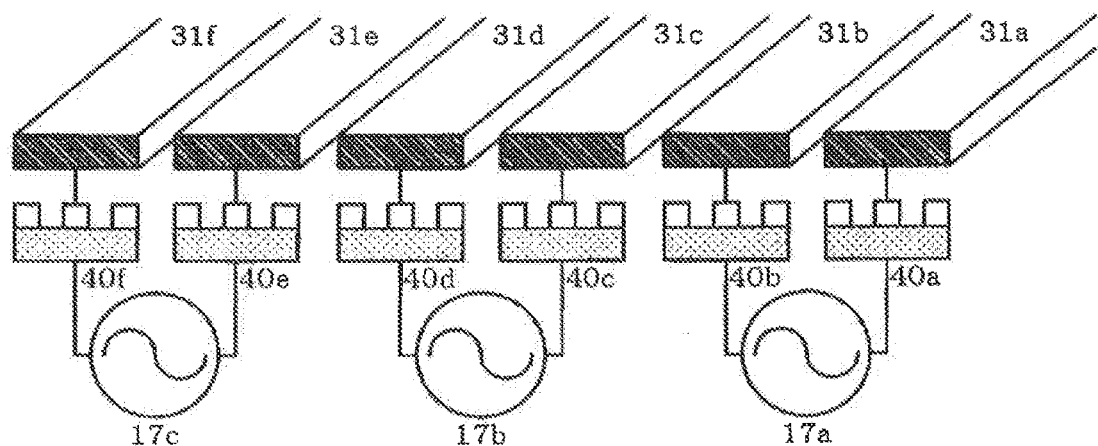
FIG. 1 is a view showing a sputtering apparatus used in one embodiment of the invention.

Hereinbelow, a detailed explanation will be made on the sputtering target or the like of the invention. The invention is, however, not limited to the following embodiment and examples.

[Sputtering Target]

The sputtering target of the invention is composed of an oxide that comprises an indium element (In), a tin element (Sn), a zinc element (Zn) and an aluminum element (Al), and comprises a homologous structure compound represented by $InAlO_3(ZnO)_m$ (m is 0.1 to 10).

The homologous crystal structure is a crystal formed of a long-period "natural superlattice" structure in which crystal layers of different substances are stacked. If the crystal period or the thickness of each thin film layer is on a nanometer level, a homologous structure compound can exhibit inherent characteristics that differ from the characteristics of a single substance or a mixed crystal in which the layers are uniformly mixed.

Due to the presence of a homologous structure compound represented by $InAlO_3(ZnO)_m$, the relative density of the target can be increased. The specific resistance of the target can be 5 mΩcm or less, for example. Abnormal discharge can be suppressed when the target has a specific resistance of 5 mΩcm or less.

As the oxide crystal having a homologous crystal structure, an oxide crystal represented by $RAO_3(MO)_m$ can be given. Here, R is a positive trivalent metal element. As examples, In, Ga, Al, Fe and B can be given. A is a positive trivalent metal element that is different from R, and examples of which include Ga, Al and Fe. M is a positive divalent metal element, and Zn and Mg can be given, for example. R, A and M may be the same metal element or may be metal elements different from each other. m is an integer, for example, and is preferably 0.1 to 10, more preferably 0.5 to 7, and further preferably 1 to 3.

The homologous structure compound represented by $InAlO_3(ZnO)_m$ may be a single substance or a mixture of two or more. Preferably, the homologous structure compound is one or more selected from a homologous structure compound represented by InAlZn$_2$O$_5$ and a homologous structure compound represented by InAlZnO$_4$.

Each of the homologous structure compound represented by InAlZn$_2$O$_5$ and a homologous structure compound represented by InAlZnO$_4$ corresponds to a case where R is In, A is Al and M is Zn.

The homologous crystal structure in the target can be confirmed by X-ray diffraction. For example, it can be confirmed by a fact that an X-ray diffraction pattern measured from powder obtained by pulverizing the target or an X-ray diffraction pattern measured directly from the target corresponds to an X-ray diffraction pattern of the crystal structure of the homologous phase assumed from the composition ratio. Specifically, it can be confirmed that the pattern is coincident with the crystal structure X-ray diffraction pattern of the homologous phase obtained from the JCPDS (Joint Committee of Powder Diffraction Standards).

The homologous crystal structure represented by InAlZnO$_4$ shows, in an X-ray diffraction, a peak pattern of No. 40-0258 of the data base of the JCPDS, or a similar (shifted) pattern. The homologous crystal structure represented by InAlZn$_2$O$_5$ shows a peak pattern of No. 40-0259 of the data base of the JCPDS or a similar (shifted) pattern.

The sputtering target of the invention preferably comprises a spinel structure compound represented by Zn$_2$SnO$_4$.

As stated in "Crystal Chemistry" (Mitsuoki Nakahira, Kodansha Ltd., 1973) or the like, the spinel structure normally means AB$_2$X$_4$ type or A$_2$BX$_4$ type structure, and a compound having such a crystal structure is referred to as a spinel structure compound.

In general, in a spinel structure, cations (normally, oxygen) are cubic close-packed, and anions are present in part of the tetrahedral interstitial site or the octahedral interstitial site thereof. A substitutional solid solution in which a part of atoms or ions in a crystal structure are replaced by other atoms and an interstitial solid solution in which other atoms are added to a position between lattices are included in a spinel structure compound.

Due to the presence of a spinel structure compound represented by Zn$_2$SnO$_4$ in the sputtering target, abnormal growth of crystal particles in an oxide forming the target can be suppressed. Abnormal particle growth may cause abnormal discharge during sputtering.

Presence or absence of the spinel structure compound represented by Zn$_2$SnO$_4$ in the sputtering target can be confirmed by X-ray diffraction.

The spinel structure compound represented by Zn$_2$SnO$_4$ is a compound showing a peak pattern of No. 24-1470 of JCPDS database or a similar (shifted) peak pattern.

It is preferred that the sputtering target of the invention do not comprise a bixbyite structure compound represented by In$_2$O$_3$.

The bixbyite structure compound (or a C-type crystal structure of a rare-earth oxide) also refers to as a C-type rare-earth oxide or Mn$_2$O$_3$ (1) type oxide. As stated in the "Technology of Transparent Conductive Film" (published by Ohmsha Ltd., edited by Japan Society for the Promotion of Science, transparent oxide/photoelectron material 166 committee, 1999) or the like, this compound has a chemical stoichiometric ratio of M$_2$X$_3$ (M is a cation and X is an anion, which is normally an oxygen ion), and one unit cell is formed of 16 M$_2$X$_3$ molecules and total 80 atoms (the number of M is 32 and the number of X is 48).

The bixbyte structure compound includes a substitutional solid solution in which a part of atoms or ions in a crystal structure are replaced by other atoms and an interstitial solid solution in which other atoms are added to a position between lattices are included in a bixbyite structure compound represented by In$_2$O$_3$.

Presence or absence of a bixbyite structure compound represented by In$_2$O$_3$ in a sputtering target can be confirmed by X-ray diffraction.

The bixbyite structure compound represented by In$_2$O$_3$ shows a peak pattern of No. 06-0416 of JCPDS (Joint Committee on Powder Diffraction Standards) or a similar (shifted) pattern.

An oxide constituting the sputtering target of the invention containing an indium element (In), a tin element (Sn), a zinc element (Zn) and an aluminum element Al) satisfy the following atomic ratio. When the oxide satisfies the following atomic ratio, the relative density of the target can be 98% or more and the bulk resistance can be 5 mΩcm or less.

$$0.10 \leq \text{In}/(\text{In}+\text{Sn}+\text{Zn}+\text{Al}) \leq 0.60 \quad (1)$$

$$0.01 \leq \text{Sn}/(\text{In}+\text{Sn}+\text{Zn}+\text{Al}) \leq 0.30 \quad (2)$$

$$0.10 \leq \text{Zn}/(\text{In}+\text{Sn}+\text{Zn}+\text{Al}) \leq 0.65 \quad (3)$$

$$0.01 \leq \text{Al}/(\text{In}+\text{Sn}+\text{Zn}+\text{Al}) \leq 0.30 \quad (4)$$

wherein in the formulas, In, Sn, Zn and Al are respectively the substance amount of the indium element, the tin element, the zinc element and the aluminum element in the sputtering target.

In the formula (1), if the atomic ratio of the In element is less than 0.01, the bulk resistance value of the sputtering target may become high, resulting in impossibility in DC sputtering.

On the other hand, if the atomic ratio of the In element exceeds 0.60, a bixbyte structure compound represented by In$_2$O$_3$ may be formed in the target. If the target comprises a bixbyte compound represented by In$_2$O$_3$ in addition to a homologous structure compound represented by InAlZnO$_4$, a homologous structure compound represented by InAlZn$_2$O$_5$ and a spinel structure compound represented by Zn$_2$SnO$_4$, the sputtering speed varies depending on the crystal phase, and hence, parts remaining unremoved may be formed, whereby abnormal discharge may occur. Further, at the time of firing, abnormal particle growth may occur at a place where In$_2$O$_3$ is agglomerated, voids may remain, and the density of the entire sintered body may not be improved.

For the reasons mentioned above, the formula (1) is 0.10≤In/(In+Sn+Zn+Al)≤0.60, preferably 0.15≤Sn/(In+Sn+Zn+Al)≤0.50, and more preferably 0.20≤Zn/(In+Sn+Zn+Al)≤0.40.

In the formula (2), if the atomic ratio of the tin element is less than 0.01, the oxide density is not fully improved, and the bulk resistance of the target may become high. On the other hand, if the atomic ratio of the tin element exceeds 0.30, the solubility in a wet etchant of a thin film obtained from the target may be lowered, whereby wet etching may become difficult.

For the reason mentioned above, the formula (2) is 0.10≤Sn/(In+Sn+Zn+Al)≤0.30, preferably 0.05≤Sn/(In+Sn+Zn+Al)≤0.25, and further preferably 0.07≤Sn (In+Sn+Zn+Al)≤0.18.

In the formula (3), if the atomic ratio of the zinc element is less than 0.10, a thin film obtained from a target may not be stable as an amorphous film. On the other hand, if the atomic ratio of a zinc element exceeds 0.65, the dissolution speed of the resulting thin film in a wet etchant becomes too high, whereby wet etching may become possible.

For the reason mentioned above, the formula (3) is $0.10 \leq Zn/(In+Sn+Zn+Al) \leq 0.65$, preferably $0.25 \leq Sn/(In+Sn+Zn+Al) \leq 0.60$ and further preferably $0.40 \leq Sn/(In+Sn+Zn+Al) \leq 0.60$.

In the formula (4), if the atomic ratio of an aluminum element is less than 0.01, the target resistance may not be fully lowered. If a channel layer of a TFT is formed by using a target, the reliability of a TFT may be deteriorated. On the other hand, if the atomic ratio of the aluminum element exceeds 0.30, $Al_2O_3$ may be generated in the target, causing abnormal discharge.

For the reasons mentioned above, the formula (4) is $0.01 \leq Sn/(In+Sn+Zn+Al) \leq 0.30$, preferably $0.02 \leq Sn/(In+Sn+Zn+Al) \leq 0.25$, and further preferably $0.02 \leq Sn/(In+Sn+Zn+Al) \leq 0.15$.

The atomic ratio of elements contained in the sintered body can be obtained by quantitatively analyzing the elements contained with Induction Coupled Plasma Atomic Emission Spectrometry (ICP-AES).

Specifically, when a solution sample is nebulized using a nebulizer, and introduced into an argon plasma (about 6000 to about 8000° C.), each element contained in the sample absorbs thermal energy, and is excited, and the orbital electrons migrate from the ground state to the orbital at a high energy level. The orbital electrons then migrate to the orbital at a lower energy level when about $10^{-7}$ to about $10^{-8}$ seconds has elapsed. In this case, the difference in energy is emitted as light. Since the emitted light has an element-specific wavelength (spectral line), the presence or absence of each element can be determined based on the presence or absence of the spectral line (qualitative analysis).

Since the intensity (luminous intensity) of each spectral line is in proportion to the number of each element contained in the sample, the element concentration in the sample can be determined by comparison with a standard solution having a known concentration (quantitative analysis).

After specifying the elements contained in the sample by qualitative analysis, the content of each element is determined by quantitative analysis, and the atomic ratio of each element is calculated from the results.

The sputtering target may comprise inevitably mixed-in impurities other than In, Sn, Zn and Al as long as the effects of the invention are not impaired. The sputtering target may substantially comprise only In, Sn, Zn and Al It is preferred that the sputtering target used in the invention have a relative density of 98% or more. If an oxide semiconductor is deposited on a large-sized substrate (1 G or more) with an increased sputtering output, it is preferred that the relative density be 98% or more.

Relative density is at least 98%, sputtering stable state is maintained. When the film is formed by increasing the sputtering power on a large substrate, a sputtering target is used having a relative density below 98%, blackening of the target surface or occurrence of abnormal discharge may be occurred. The relative density is preferably 98.5% or more, with 99% or more being further preferable.

The relative density can be measured by the Archimedian method. The relative density is preferably 100% or less. If the relative density exceeds 100%, metal particles may be generated in a sintered body or a lower oxide may be generated. Therefore, it is required to adjust strictly the amount of oxygen supplied at the time of film formation.

Further, the density can be adjusted by a post treatment or the like such as a heat treatment in the reductive atmosphere after sintering. As the reductive atmosphere, an atmosphere such as argon, nitrogen and hydrogen, or an atmosphere of a mixture of these gases can be used.

The bulk specific resistance (conductivity) is preferably 5 mΩcm or less, more preferably 3 mΩcm or less. By a bulk specific resistance of 5 mΩcm or less, abnormal discharge can be suppressed.

The bulk specific resistance mentioned above can be measured by a four probe method using a resistivity meter.

It is desired that the maximum particle size of the crystal in the sintered body be 8 μm or less. If the crystal is grown to have a particle size exceeding 8 μm, nodules may hardly be generated.

When the target surface is ground by sputtering, the grinding speed differs depending on the direction of the crystal surface, whereby unevenness is generated on the target surface. The size of this unevenness varies depending on the particle size of the crystal present in the sintered body. It is assumed that, and in the target formed of a sintered body having a large crystal particle size, a greater scale of unevenness occurs, and nodules are generated from this convex part.

The maximum particle size of the crystal of the sputtering target is obtained as follows. If the sputtering target has a circular shape, at five locations in total, i.e. the central point (one) and the points (four) which are on the two central lines crossing orthogonally at this central point and are middle between the central point and the peripheral part, or if the sputtering target has a square shape, at five locations in total, i.e. the central point (one) and middle points (four) between the central point and the corner of the diagonal line of the square, the maximum diameter is measured for the biggest particle observed within a 100-μm square. The maximum particle size is the average value of the particle size of the biggest particle present in each of the frames defined by the five locations. As for the particle size, the longer diameter of the crystal particle is measured. The crystal particles can be observed by the scanning electron microscopy (SEM).

The method for producing a sputtering target of the invention comprises the following two steps, for example:
(1) A step in which raw material compounds are mixed and formed to obtain a formed body
(2) A step in which the above-mentioned formed body is sintered Hereinbelow, an explanation will be made based on these steps.
(1) A step in which raw material compounds are mixed and formed to obtain a formed body No specific restrictions are imposed on the raw material compounds, and a compound containing one or more element selected from In, Sn, Zn and Al can be used. It suffices that a mixture of the raw material compounds used satisfy the following atomic ratio:

$$0.10 \leq In/(In+Sn+Zn+Al) \leq 0.60 \quad (1)$$

$$0.01 \leq Sn/(In+Sn+Zn+Al) \leq 0.30 \quad (2)$$

$$0.10 \leq Zn/(In+Sn+Zn+Al) \leq 0.65 \quad (3)$$

$$0.01 \leq Al/(In+Sn+Zn+Al) \leq 0.30 \quad (4)$$

wherein In, Sn, Zn and Al are respectively the substance amount of the indium element, the tin element, the zinc element and the aluminum element.

As the compound containing one or more element selected from In, Sn, Zn and Al, a combination of indium oxide, tin oxide, zinc oxide and an aluminum metal, a combination of indium oxide, tin oxide, zinc oxide and aluminum oxide or the like can be mentioned.

It is preferred that the raw material compounds mentioned above be powder.

It is preferred that the raw material be a mixed powder of indium oxide, tin oxide, zinc oxide and aluminum oxide.

If a simple metal is used as a raw material, when a combination of indium oxide, tin oxide, zinc oxide and aluminum metal is used as raw material powders, for example, metal particles of aluminum may be present in the resulting sintered body. As a result, metal particles on the target surface are molten during film formation and hence cannot be emitted from the target, resulting in a great difference between the composition of the film and the composition of the sintered body.

If the raw material compound is powder, the average particle diameter of the raw material powder is preferably 0.1 µm to 1.2 µm, more preferably 0.1 µm to 1.0 µm. The average particle diameter of the raw material powder can be measured by a laser diffraction particle size distribution measuring apparatus or the like.

For example, an oxide containing $In_2O_3$ powder having an average particle diameter of 0.1 µm to 1.2 µm, $SnO_2$ powder having an average particle diameter of 0.1 µm to 1.2 µm, ZnO powder having an average particle diameter of 0.1 µm to 1.2 µm and $Al_2O_3$ powder having an average particle diameter of 0.1 µm to 1.2 µm is used as the raw material powder. They may be contained in an amount ratio that satisfies the above-mentioned formulas (1) to (4).

The method for mixing and forming of the raw material compound is not particularly restricted, and a known method can be used. For example, a water-based solvent is compounded with raw material powders including indium oxide powder, tin oxide powder, zinc oxide powder and aluminum oxide powder, and the resulting slurry is mixed for 12 hours or more. Then, the mixture is subjected to solid-liquid separation, dried and granulated, and the granulated product is then put in a mold and formed, whereby a formed body is obtained.

As for the method for mixing, a wet or dry ball mill, a vibration mill, a beads mill or the like can be used. In order to obtain uniform and fine crystal particles and voids, the most preferable method is a beads mill mixing method since it can pulverize the aggregate efficiently for a short period of time and can realize a favorable dispersed state of additives.

When a ball mill is used for mixing, the mixing time is preferably 15 hours or more, more preferably 19 hours or more. If the mixing time is insufficient, a high-resistant compound such as $Al_2O_3$ may be generated in the oxide sintered body finally obtained.

When a beads mill is used for pulverizing and mixing, the mixing time varies depending on the size of the apparatus used and the amount of slurry to be treated. However, the mixing time is controlled appropriately such that the particle distribution in the slurry becomes uniform, i.e. all of the particles have a particle size of 1 µm or less.

In any type of mixing methods, an arbitral amount of a binder is added, and mixing may be conducted simultaneously with the addition of the binder. As the binder, polyvinyl alcohol, vinyl acetate or the like can be used.

For granulation of a raw material powder slurry obtained by mixing, it is preferable to use quick dry granulation. As the apparatus for quick dry granulation, a spray dryer is widely used. Specific drying conditions are determined according to conditions such as the concentration of slurry to be dried, the temperature of hot air used for drying and the amount of wind. For actually conducting the quick dry granulation, it is required to obtain optimum conditions in advance.

On the other hand, in the case of natural dry granulation, a homogenous granulated powder may not be obtained easily. That is, since the speed of sedimentation differs due to the difference in specific gravity of the raw material powder, separation of $In_2O_3$ powder, $SnO_2$ powder, ZnO powder and $Al_2O_3$ powder may occur. If a sintered body is made by using this non-uniform granulated powder, abnormal discharge may occur during sputtering due to the presence of $Al_2O_3$ or the like within the sintered body.

The granulated powder can normally be formed to a formed body at a pressure of 1.2 ton/cm² or more by means of a mold press or cold isostatic pressing (CIP).

(2) Step in which the formed body is sintered

The resulting formed body is sintered at 1200 to 1650° C. for 10 to 50 hours to obtain a sintered body.

The sintering temperature is preferably 1350 to 1600° C., more preferably 1400 to 1600° C., and further preferably 1450 to 1600° C. The sintering time is preferably 12 to 40 hours, more preferably 13 to 30 hours.

If the sintering temperature is lower than 1200° C. and the sintering time is shorter than 10 hours, $Al_2O_3$ or the like may be formed within the target, thereby causing abnormal discharge. On the other hand, if the calcination temperature exceeds 1650° C. or the calcination time exceeds 50 hours, an increase in average crystal diameter due to significant crystal particle growth or generation of large voids may occur, thereby causing lowering in strength of a sintered body or occurrence of abnormal discharge.

As the method of sintering used in the invention, in addition to the atmospheric sintering pressing, a pressure sintering method such as hot pressing, oxygen pressurization and hot isostatic pressing or the like can be used. In respect of a decrease in production cost, possibility of mass production and easiness in production of a large-sized sintered body, it is preferable to use atmospheric sintering pressing.

In the atmospheric sintering pressing, a formed body is sintered in the air or the oxidizing gas atmosphere. Preferably, a formed body is sintered in the oxidizing gas atmosphere. The oxidizing gas atmosphere is preferably an oxygen gas atmosphere. It suffices that the oxygen gas atmosphere be an atmosphere having an oxygen concentration of 10 to 100 vol %, for example. In the method for producing the sintered body, the density of the sintered body can be further increased by introducing an oxygen gas atmosphere during the temperature-elevating step.

As for the temperature-elevating rate at the time of sintering, it is preferred that the temperature-elevating rate be 0.1 to 2° C./min in a temperature range of from 800° C. to a sintering temperature (1200 to 1650° C.).

In the sputtering target of an oxide comprising an indium element (In), a tin element (Sn), a zinc element (Zn) and an aluminum element (Al), a temperature range of from 800° C. and higher is a range where sintering proceeds most quickly. If the temperature-elevating rate in this temperature range is less than 0.1° C./min, growth of crystal particles becomes significant, whereby an increase in density may not be attained. On the other hand, if the temperature-elevating rate is higher than 2° C./min, $Al_2O_3$ or the like may be deposited within the target.

The temperature-elevating rate from 800° C. to a sintering temperature is preferably 0.1 to 1.3° C./min, more preferably 0.1 to 1.1° C./min.

In order to allow the bulk resistance of the sintered body obtained in the above-mentioned calcination step to be uniform in the entire target, a reduction step may be further provided, if necessary.

As the reduction method, a method using a reductive gas, a reduction treatment by vacuum calcination, a reduction treatment by calcination in an inert gas or the like can be given, for example.

In the case of a reduction treatment by using a reductive gas, hydrogen, methane, carbon monoxide, or a mixed gas of these gases with oxygen or the like can be used.

In the case of a reduction treatment by calcination in an inert gas, nitrogen, argon, or a mixed gas of these gases with oxygen or the like can be used.

The temperature at the time of the above-mentioned reduction treatment is normally 100 to 800° C., preferably 200 to 800° C. The reduction treatment is conducted normally for 0.01 to 10 hours, preferably 0.05 to 5 hours.

To sum up, in the method for producing a sintered body used in the invention, a water-based solvent is compounded with raw material powders containing mixed powder of indium oxide power, tin oxide power, zinc oxide powder and aluminum oxide powder to obtain a slurry. Thereafter, the slurry is mixed for 12 hours or longer, and is subjected to solid-liquid separation, dried and granulated. Subsequently, the granulated product is put in a mold and formed. Then, the resulting formed body is sintered at 1200 to 1650° C. for 10 to 50 hours with a temperature-elevating rate in a temperature range of from 800° C. to the sintering temperature being 0.1 to 2° C./min, whereby a sintered body can be obtained.

By processing the sintered body obtained above, the sputtering target of the invention can be obtained. Specifically, by grinding the sintered body into a shape suited to be mounted in a sputtering apparatus, a sputtering target material is obtained. Then, the sputtering target material is bonded to a backing plate, whereby a sputtering target can be obtained.

In order to allow the sintered body to be a target material, the sintered body is ground by means of a surface grinder to allow the surface roughness Ra to be 0.5 μm or less. Further, the sputtering surface of the target material may be subjected to mirror finishing, thereby allowing the average surface roughness thereof Ra to be 1000 Å or less.

For this mirror finishing (polishing), known polishing techniques such as mechanical polishing, chemical polishing, mechano-chemical polishing (combination of mechanical polishing and chemical polishing) or the like may be used. For example, it can be obtained by polishing by means of a fixed abrasive polisher (polishing liquid: water) to attain a roughness of #2000 or more, or can be obtained by a process in which, after lapping by a free abrasive lap (polisher: SiC paste or the like), lapping is conducted by using diamond paste as a polisher instead of the SiC paste. There are no specific restrictions on these polishing methods.

It is preferable to finish the surface of the target material by means of a #200 to #10,000 diamond wheel, particularly preferably by means of a #400 to #5,000 diamond wheel. If a diamond wheel with a mesh size of smaller than #200 or larger than #10,000 is used, the target material may be broken easily.

It is preferred that the surface roughness Ra of the target material be 0.5 μm or less and that the grinding surface have no directivity. If Ra is 0.5 μm or larger or the grinding surface has directivity, occurrence of abnormal discharge generation of particles may be occurred.

Finally, the thus processed target material may be subjected to a cleaning treatment. For cleaning, air blowing, washing with running water or the like can be used. When foreign matters are removed by air blowing, foreign matters can be removed more effectively by air intake by means of a dust collector from the side opposite from the nozzle.

Since the above-mentioned air blow or washing with running water has its limit, ultrasonic cleaning or the like can also be conducted. In ultrasonic cleaning, it is effective to conduct multiplex oscillation within a frequency range of 25 to 300 KHz. For example, it is preferable to perform ultrasonic cleaning by subjecting 12 kinds of frequency composed of every 25 KHz in a frequency range of 25 to 300 KHz to multiplex oscillation.

The thickness of the target material is normally 2 to 20 mm, preferably 3 to 12 mm, and particularly preferably 4 to 6 mm.

By bonding the target material obtained in the manner as mentioned above to a backing plate, a sputtering target can be obtained.

A plurality of target materials may be provided in a single backing plate to be used as a substantially single target.

The sputtering target of the invention can have a relative density of 98% or more and a bulk resistance of 5 mΩcm or less. When sputtering is conducted, occurrence of abnormal discharge can be suppressed. The sputtering target of the invention can form a high-quality oxide semiconductor thin film efficiently and inexpensively and in an energy-saving manner.

[Oxide Semiconductor Thin Film]

By forming the sputtering target of the invention into a film by a sputtering method, the oxide semiconductor thin film of the invention can be obtained.

The oxide semiconductor thin film of the invention is composed of indium, tin, zinc, aluminum and oxygen and preferably satisfies the following atomic ratios (1) to (4):

$$0.10 \leq In/(In+Sn+Zn+Al) \leq 0.60 \tag{1}$$

$$0.01 \leq Sn/(In+Sn+Zn+Al) \leq 0.30 \tag{2}$$

$$0.10 \leq Zn/(In+Sn+Zn+Al) \leq 0.65 \tag{3}$$

$$0.01 \leq Al/(In+Sn+Zn+Al) \leq 0.30 \tag{4}$$

wherein In, Sn, Zn and Al are respectively the substance amount of the indium element, the tin element, the zinc element and the aluminum element.

In the formula (1), if the amount of the In element is less than 0.10, the bulk resistance of the sputtering target is increased, and as a result, DC sputtering becomes impossible. On the other hand, if the amount of the In element exceeds 0.60, if the formed film is applied to the channel layer of a TFT, reliability may be lowered.

In the formula (2), if the amount of the Sn element is less than 0.01, the target resistance is increased, and film formation may not be stabilized due to occurrence of abnormal discharge during sputtering. On the other hand, if the amount of an Sn element exceeds 0.30, solubility of the resulting thin film in a wet etchant is lowered, whereby wet etching may become difficult.

In the formula (3), if the amount of the Zn element is less than 0.10, the resulting film may not be a stable amorphous film. On the other hand, if the amount of the Zn element exceeds 0.65, since the dissolution speed of the resulting thin film in a wet etchant is too high, resulting in difficulty in wet etching.

In the formula (4), if the amount of the Al element is less than 0.01, the oxygen partial pressure during film formation may be increased. Since the Al element is bonded to oxygen strongly, it can lower the oxygen partial pressure during film formation. Further, when a channel layer is formed and applied to a TFT, reliability may be lowered. On the other hand, if the amount of the Al element exceeds 0.30, $Al_2O_3$ may be generated in the target, abnormal discharge may occur at the time of film formation by sputtering, leading to unstable film formation.

The carrier concentration of the oxide semiconductor thin film is normally $10^{19}/cm^3$ or less, preferably $10^{13}$ to $10^{18}/cm^3$, further preferably $10^{14}$ to $10^{18}/cm^3$, and particularly preferably $10^{15}$ to $10^{18}/cm^3$.

If the carrier concentration of the oxide layer is larger than $10^{19}$ $cm^{-3}$, current leakage may not occur easily when a device such as a thin film transistor is fabricated. Further, since the transistor may become normally-on or may not have a large on-off ratio, good transistor performance may not be exhibited. Further, if a carrier concentration is less than $10^{13}$ $cm^{-3}$, the device can be driven as a TFT due to small numbers of carriers.

The carrier concentration of the oxide semiconductor thin film can be measured by the hall-effect measurement.

The sputtering target of the invention has a high conductivity. Accordingly, a DC sputtering method having a high film forming speed can be applied.

In addition to the above-mentioned DC sputtering method, the RF sputtering, the AC sputtering, the pulse DC sputtering can also be applied, and sputtering free from abnormal discharge is possible.

The oxide semiconductor thin film can also be prepared by the deposition method, the sputtering method, the ion plating method, the pulse laser deposition method or the like can be prepared.

As the sputtering gas (atmosphere), a mixed gas of atoms of a rare gas such as argon and an oxidizing gas can be used. As the oxidizing gas, $O_2$, $CO_2$, $O_3$, $H_2O$, $N_2O$ or the like can be given. As the sputtering gas, a mixed gas composed of rare gas atoms, and one or more molecules selected from water molecules, oxygen molecules and nitrous oxide molecules is preferable. It is more preferred that the sputtering gas be a mixed gas that contains rare metal atoms and at least water molecules.

The oxygen partial pressure at the time of film formation by sputtering is preferably 0% or more and less than 40%. A thin film formed under the conditions in which the oxygen partial pressure is 40% or more may have a significantly decreased carrier concentration as less than $10^{13}$ $cm^{-3}$.

The oxygen partial pressure is preferably 0% to 30% and particularly preferably 0% to 20%.

The partial pressure ratio of water contained in a sputtering gas (atmosphere) at the time of depositing an oxide thin film in the invention, i.e. [$H_2O$]/([$H_2O$]+[rare gas]+[other molecules]), is preferably 0.1 to 25%.

If the water partial pressure exceeds 25%, the film density may hardly be lowered, and as a result, the degree of overlapping of the In 5s orbital may be small, and as a result, mobility is lowered. The water partial pressure in the atmosphere at the time of sputtering is more preferably 0.7 to 13%, with 1 to 6% being particularly preferable.

The substrate temperature at the time of film formation by sputtering is preferably 25 to 120° C., further preferably 25 to 100° C., and particularly preferably 25 to 90° C. If the substrate temperature at the time of film formation is higher than 120° C., oxygen or the like introduced at the time of film formation may be incorporated in a small amount, and the carrier concentration of the thin film after heating may exceed $10^{19}/cm^3$. Further, if the substrate temperature at the time of film formation is lower than 25° C., the density of the thin film may be lowered, and as a result, mobility of a TFT may be lowered.

It is preferred that the oxide thin film obtained by sputtering be further subjected to an annealing treatment by retaining at 150 to 500° C. for 15 minutes to 5 hours. The annealing treatment temperature after film formation is more preferably 200° C. or more and 450° C. or less, further preferably 250° C. or more and 350° C. or less. By conducting the above-mentioned annealing treatment, semiconductor properties can be obtained.

The heating atmosphere is not particularly restricted. In respect of carrier control properties, the air atmosphere or the oxygen-circulating atmosphere is preferable.

In the annealing treatment as the post treatment of the oxide thin film, in the presence or absence of oxygen, a lamp annealing apparatus, a laser annealing apparatus, a thermal plasma apparatus, a hot air heating apparatus, a contact heating apparatus or the like can be used.

The distance between the target and the substrate at the time of sputtering is preferably 1 to 15 cm in a direction perpendicular to the film formation surface of the substrate, with 2 to 8 cm being further preferable. If this distance is less than 1 cm, the kinetic energy of particles of target-constituting elements which arrive the substrate may become large, good film properties may not be obtained, and in-plane distribution of the film thickness and the electric characteristics may occur. If the interval between the target and the substrate exceeds 15 cm, the kinetic energy of particles of target-constituting elements which arrive the substrate may be too small, and a dense film may not be obtained, and as a result, good semiconductor properties may not be attained.

As for the formation of an oxide thin film, it is desirable that film formation be conducted by sputtering in an atmosphere having a magnetic field intensity of 300 to 1500 gausses. If the magnetic field intensity is less than 300 gausses, since the plasma density may decrease, sputtering may not be conducted if the sputtering target has a high resistance. On the other hand, if the magnetic field intensity exceeds 1500 gausses, the film thickness and the electric characteristics of the film may be poor-controlled.

No specific restrictions are imposed on the pressure of a gas atmosphere (sputtering pressure), as long as plasma is stably discharged. The pressure is preferably 0.1 to 3.0 Pa, further preferably 0.1 to 1.5 Pa, with 0.1 to 1.0 Pa being particularly preferable. If the sputtering pressure exceeds 3.0 Pa, the mean free path of sputtering particles may be shortened, thereby lowering the density of a thin film. If the sputtering pressure is less than 0.1 Pa, fine crystals may be formed in a film during film formation. Meanwhile, the sputtering pressure is the total pressure in the system at the start of sputtering after rare gas atoms (e.g. argon), water molecules, oxygen molecules or the like are introduced.

In the process of producing a thin-film transistor, in order to remove stains of a metal such as Cu of a semiconductor substrate, as well as to decrease the surface potential caused by dangling bond or the like of the surface of a gate insulating film, it is preferred that the surface of the semiconductor substrate or the gate insulating film be cleaned.

As the cleaning solution, a cyan (CN)-containing solution can be used. As the cyan (CN)-containing solution used for cleaning, it is preferable to use the following. Hydrogen cyanide (HCN) is dissolved in water or ultrapure water, or at least one solvent selected from an alcohol-based solvent, a ketone-based solvent, a nitrile-based solvent, an aromatic hydrocarbon-based solvent, carbon tetrachloride, an ether-based solvent, an aliphatic alkane-based solvent or a mixed solvent of these. Further, the resulting solution is diluted to a predetermined concentration, followed by adjusting the hydrogen ion concentration index (the so-called pH value) in the solution with an ammonium aqueous solution or the like to a range of preferably 9 to 14.

The content of cyan (CN) is 100 ppm or less, for example, preferably 1 ppm to 10 ppm. It is preferred that the cyan-containing solution having a hydrogen ion concentration index (pH) of 9 to 14 be heated, and the surface of the semiconductor substrate or the gate insulating film be subjected to a cleaning treatment at a prescribed temperature of 50° C. or less, preferably 30° C. to 40° C.

By using an aqueous HCN solution, cyanide ions (CN$^-$) is reacted with copper on the surface of the substrate to form [Cu(CN)$_2$]—, whereby contamination by copper is removed. [Cu(CN)$_2$]— reacts with CN$^-$ ions in an aqueous HCN solution, and at a pH 10, it is present stably as [Cu(CN)$_4$]$^{3-}$. The complex ion forming capability of CN$^-$ ions is significantly large. Even in an aqueous solution of HCN having a very low concentration, CN$^-$ ions effectively react, thereby enabling removal of contamination by copper.

The formation of an oxide semiconductor thin film may be conducted by the following AC sputtering.

Substrates are transported in sequence to positions opposing to 3 or more targets arranged in parallel with a prescribed interval in a vacuum chamber. Then, a negative potential and a positive potential are applied alternately from an AC power source to each of the targets, whereby plasma is caused to be generated on the target.

At this time, film formation is conducted by applying at least one output from an AC power source between 2 or more targets connected divergently, while switching the target to which a potential is applied. That is, at least one output from the AC power source is connected divergently to 2 or more targets respectively, whereby film formation is conducted while applying differential potentials to the adjacent targets.

If an oxide semiconductor thin film is formed by AC sputtering, it is preferred that sputtering be conducted in an atmosphere of a mixed gas containing rare gas atoms, and one or more molecules selected from water molecules, oxygen molecules and nitrous oxide molecules, for example. It is particularly preferred that sputtering be conducted in an atmosphere of a mixed atom containing water molecules.

If film formation is conducted by AC sputtering, not only it is possible to obtain an oxide layer which has excellent large-area uniformity on the industrial basis, and also it can be expected that the use efficiency of the target is increased.

If a film is formed by sputtering on a large-area substrate in which the length of one side exceeds 1 m, it is preferable to use an AC sputtering apparatus for producing a large-area film such as that disclosed in JP-A-2005-290550.

The AC sputtering apparatus disclosed in JP-A-2005-290550 specifically has a vacuum chamber, a substrate holder arranged within the vacuum chamber and a sputtering source arranged at a position opposing to this substrate holder. FIG. 1 shows essential parts of a sputtering source of the AC sputtering apparatus. The sputtering source has a plurality of sputtering parts, which respectively have plate-like targets 31a to 31f. Assuming that the surface to be sputtered of each target 31a to 31f is a sputtering surface, the sputtering parts are arranged such that the sputtering surfaces are on the same plane. Targets 31a to 31f are formed in a long and narrow form having a longitudinal direction, and they have the same shape. The targets are arranged such that the edge parts (side surface) in the longitudinal direction of the sputtering surface are arranged in parallel with a prescribed interval. Accordingly, the side surfaces of the adjacent targets 31a to 31f are in parallel.

Outside the vacuum chamber, AC power sources 17a to 17c are arranged. Among the two terminals of AC power sources 17a to 17c, one terminal is connected to one electrode of the adjacent two electrodes, and the other terminal is connected to the other electrode. The two terminals of each AC power source 17a to 17c output voltages differing in polarity (positive and negative), and the targets 31a to 31f are fitted in close contact with the electrode, whereby, to adjacent two targets 31a to 31f, an alternate voltage differing in polarity is applied from the AC power sources 17a to 17c. Therefore, among the adjacent targets 31a to 31f, if one is set in a positive potential, the other is set in a negative potential.

On the side opposite to the targets 31a to 31f of the electrode, magnetic field forming means 40a to 40f are arranged. Each magnetic field forming means 40a to 40f has a long and narrow ring-like magnet having an approximately same size as that of the outer circumference of the targets 31a to 31f, and a bar-like magnet which is shorter than the length of the ring-like magnet.

Each ring-like magnet is arranged at the position right behind one corresponding targets 31a to 31f such that the ring-like magnets are arranged in parallel with the longitudinal direction of the targets 31a to 31f. As mentioned above, since the targets 31a to 31f are arranged in parallel with a prescribed interval, the ring-like magnets are arranged with the same interval as that for the targets 31a to 31f.

The AC power density when an oxide target is used in AC sputtering is preferably 3 W/cm$^2$ or more and 20 W/cm$^2$ or less. If the power density is less than 3 W/cm$^2$, the film-forming speed is slow, and is not economically advantageous in respect of production. A power density exceeding 20 W/cm$^2$ may cause breakage of the target. A more preferable power density is 3 W/cm$^2$ to 15 W/cm$^2$.

The frequency of the AC sputtering is preferably in the range of 10 kHz to 1 MHz. If the frequency is lower than 10 kHz, noise problems occur. If the frequency exceeds 1 MHz, sputtering may be conducted in other places than the desired target position due to excessively wide scattering of plasma, whereby uniformity may be deteriorated. A more preferable AC sputtering frequency is 20 kHz to 500 kHz.

Conditions or the like at the time of sputtering other than those mentioned above may be appropriately selected from the conditions given above.

[Thin Film Transistor and Display]

The above-mentioned oxide thin film can be used in a thin film transistor. It can be used particularly preferably as a channel layer. A thin film transistor using the oxide semiconductor thin film of the invention as a channel layer has a high mobility of a field effect mobility of 15 cm$^2$/Vs or more and a high reliability.

No specific restrictions are imposed on the device configuration of the thin film transistor of the invention, as long as it has the above-mentioned oxide thin film as a channel layer. Known various device configurations can be used.

The thickness of the channel layer in the thin film transistor of the invention is normally 10 to 300 nm, preferably 20 to 250 nm, more preferably 30 to 200 nm, further preferably 35 to 120 nm, and particularly preferably 40 to 80 nm. If the thickness of the channel layer is less than 10 nm, due to uniformity of the film thickness when the film is formed to have a large area, the properties of a TFT fabricated may become un-uniform within the plane. A film thickness exceeding 300 nm is not preferable, since the film formation time may be prolonged, making industrial application impossible.

After annealing, the channel layer of the thin film transistor of the invention may be partially crystallized at least in a region overlapping the gate electrode. The "crystallized" means that crystal particles grow from the amorphous state to the state in which crystal nucleus is generated or the state in which crystal nucleus has been generated. In particular, when part of the back channel side is crystallized, reduction resistance relative to the plasma process (CVD process, or the like) is improved, whereby reliability of a TFT is increased.

The crystallized region can be confirmed by an electron diffraction image of a transmission electron microscope (TEM: Transmission Electron Microscope).

The channel layer in the thin film transistor of the invention is normally used in the N-type region. However, in combination with various P-type semiconductors such as a P-type Si-based semiconductor, a P-type oxide semiconductor and a P-type organic semiconductor, the channel layer can be used in various semiconductor devices such as a PN junction transistor.

In the thin film transistor of the invention, it is preferred that a protective film be provided on the channel layer. It is preferred that the protective film in the thin film transistor of the invention comprise at least $SiN_x$. As compared with $SiO_2$, $SiN_x$ is capable of forming a dense film, and hence has an advantage that it has significant effects of preventing deterioration of a TFT.

The protective film may comprise, in addition to $SiN_x$, an oxide such as $SiO_2$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTiO_3$, $BaTa_2O_5$, $Sm_2O_3$, $SrTiO_3$ or AlN.

As for the oxide thin film of the invention that comprises an indium element (In), a tin element (Sn), a zinc element (Zn) and an aluminum element (Al), since it contains Al, resistance to reduction by the CVD process is improved. As a result, the back channel side is hardly reduced by a process in which a protective film is prepared, whereby $SiN_x$ can be used as a protective film.

Before forming a protective film, it is preferred that the channel layer be subjected to an ozone treatment, an oxygen plasma treatment, a nitrogen dioxide plasma treatment or a nitrous oxide plasma treatment. Such a treatment may be conducted at any time as long as it is after the formation of a channel layer and before the formation of a protective film. However, it is desirable that the treatment be conducted immediately before the formation of a protective film. By conducting such a pretreatment, generation of oxygen deficiency in the channel layer can be suppressed.

If hydrogen in the oxide semiconductor film diffuses during the driving of a TFT, the threshold voltage may be shifted, resulting in lowering of reliability of a TFT. By subjecting the channel layer to an ozone treatment, an oxygen plasma treatment or a nitrous oxide plasma treatment, the In—OH bonding in the thin film structure is stabilized, whereby diffusion of hydrogen in the oxide semiconductor film can be suppressed.

In the photolithography process of this embodiment, before applying a photoresist, an insulating film with a thickness of several nm may be formed on the surface of an oxide semiconductor film. By this process, it is possible to eliminate direct contact of the oxide semiconductor film and the resist. As a result, it is possible to prevent impurities contained in the resist from entering the oxide semiconductor film.

The thin film transistor normally comprises a substrate, a gate electrode, a gate insulating layer, an organic semiconductor layer (channel layer), a source electrode and a drain electrode. The channel layer is as mentioned above. A known material can be used for the substrate.

No particular restrictions are imposed on the material forming the gate insulating film in the thin film transistor of the invention. A material which is generally used can be arbitrary selected. Specifically, a compound such as $SiO_2$, $SiN_x$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTiO_3$, $BaTa_2O_5$, $SrTiO_3$, $Sm_2O_3$, AlN or the like can be used, for example. Among these, $SiO_2$, $SiN_x$, $Al_2O_3$, $Y_2O_3$, $HfO_2$ and $CaHfO_3$ are preferable, with $SiO_2$, $SiN_x$, $HfO_2$ and $Al_2O_3$ being more preferable.

The gate insulating film can be formed by the plasma CVD (Chemical Vapor Deposition) method, for example.

If a gate insulating film is formed by the plasma CVD method and a channel layer is formed thereon, hydrogen in the gate insulating film diffuses in the channel layer, and as a result, deterioration of film quality of the channel layer or lowering of reliability of a TFT may be caused. In order to prevent deterioration of film quality of the channel layer or lowering of reliability of a TFT, it is preferred that the gate insulating film be subjected to an ozone treatment, an oxygen plasma treatment, a nitrogen dioxide plasma treatment or a nitrous oxide plasma treatment before the formation of a channel layer. By conducting such a pre-treatment, deterioration of film quality of the channel layer or lowering of reliability of a TFT can be prevented.

The number of oxygen atoms of these oxides does not necessarily coincide with the stoichiometric ratio. For example, $SiO_2$ or $SiO_x$ may be used.

The gate insulating film may have a structure in which two or more different insulating films are stacked. The gate insulating film may be crystalline, polycrystalline, or amorphous. The gate insulating film is preferably polycrystalline or amorphous from the viewpoint of easiness of industrial production.

No specific restrictions are imposed on the material forming each electrode in the thin film transistor, i.e. a drain electrode, a source electrode and a gate electrode, and materials which are generally used can be arbitrarily selected. For example, transparent electrodes such as ITO, IZO, ZnO, $SnO_2$ or the like, a metal electrode such as Al, Ag, Cu, Cr, Ni, Mo, Au, Ti, and Ta or an alloy metal electrode containing these metals can be used.

The S value can be derived from a reciprocal of the slope of a graph of Log(Id)-Vg obtained from the results of transfer characteristics. The unit of the S value is V/decade, and a smaller S value is preferable. The S value is preferably 0.8 V/decade or less, more preferably 0.5V/dec or less, further preferably 0.3 V/dec or less, and 0.2 V/dec or less is particularly preferable. If the S value is 0.8 V/dec or less, the driving voltage is reduced, and consumption power may be able to be reduced. In particular, if the thin film transistor is used in an organic EL display, since it is driven by DC driving, it is preferable to allow the S value to be 0.3V/dec or less in view of a significant decrease in consumption power.

The S value (Swing Factor) is a value indicating the sharpness of rising of the drain current from the off-state to the on-state when the gate voltage of a transistor is increased from the off-state.

Specifically, the S value is defined by the following formula. As shown by the following formula, the S value is an increase in gate voltage when the drain current increases by one digit (10 times).

$$S\text{ value}=dVg/d\log(Ids)$$

When the S value is small, the rising of the drain current is sharp ("Thin Film Transistor Technology", by Ukai Yasuhiro, 2007, published by Kogyo Chosakai Publishing, Inc.). If the S value is large, there may be a possibility that a high gate voltage is required to be applied at the time of switching from ON to OFF, resulting in large consumption power.

The oxide thin film composed of In, Sn, Zn and Al that is applied to the channel layer can be subjected to wet etching in an organic acid-based etching liquid (for example, oxalic acid-etching liquid), and is hardly dissolved in an inorganic acid-based wet etching liquid (for example, a mixed acid wet etching liquid of phosphoric acid/nitric acid/acetic acid: PAN). The selection ratio of wet etching to Mo (molybdenum) or Al (aluminum) or the like used in the electrode is large. Therefore, by using the oxide thin film composed of In, Sn, Zn and Al in a channel layer, a channel-etch type thin film transistor can be prepared.

Each of the drain electrode, the source electrode and the gate electrode may have a multi-layer structure in which two or more different conductive layers are stacked. In particular, since the source/drain electrodes are required to be used in low-resistance wiring, the electrodes may be used by sandwiching a good conductor such as Al and Cu between metals having good adhesiveness such as Ti and Mo.

The thin film transistor of the invention can be applied to various integrated circuits such as a field effect transistor, a logical circuit, a memory circuit and a differential amplifier circuit. Further, in addition to a field effect transistor, it can be applied to a static induction transistor, a Schottky barrier transistor, a Schottky diode and a resistance element.

As for the configuration of the thin film transistor of the invention, a known configuration such as a bottom-gate configuration, a bottom-contact configuration and a top-contact configuration can be used without restrictions.

In particular, a bottom-gate configuration is advantageous since high performance can be obtained as compared with a thin film transistor comprising amorphous silicon and ZnO. The bottom-gate configuration is preferable since the number of masks at the time of production can be decreased easily and the production cost for application such as a large-sized display or the like can be reduced easily.

The thin film transistor of the invention can preferably be used as a display.

For use in a large-sized display, a channel-etch type bottom-gate thin film transistor is particularly preferable. A channel-etch type bottom-gate thin film transistor can produce a panel for a display at a low cost since the number of photo-masks used in photolithography is small. Among these, a channel-etch type thin film transistor having a bottom-gate configuration and a channel-etch type thin film transistor having a top-contact configuration are particularly preferable since they have excellent properties such as mobility and can be industrialized easily.

EXAMPLES

Examples 1 to 8

[Production of Oxide Sintered Body]

As raw material powders, the following oxide powders were used. The median size D50 was employed as an average particle size for the following oxide powders. The average particle size was measured by a laser diffraction particle size analyzer SALD-300V (manufactured by Shimadzu Corporation).

Indium oxide powder: average particle size 0.98 μm
Tin oxide powder: average particle size 0.98 μm
Zinc oxide powder: average particle size 0.96 μm
Aluminum oxide powder: average particle size 0.98 μm The above-mentioned powders were weighed such that the atomic ratio shown in Table 1 was attained. They were finely pulverized and mixed uniformly and then granulated by adding a binder for forming. Subsequently, the mixed powder of the raw materials was filled in the mold uniformly and press-formed at a pressing pressure of 140 MPa in a cold press apparatus.

The formed body thus obtained was sintered in a sintering furnace at a temperature-elevation rate of temperature (from 800° C. to a sintering temperature) at a sintering temperature for a sintering time shown in Table 1 to produce a sintered body. During the temperature increasing, the atmosphere was oxide, and otherwise air. The temperature-decreasing rate was 15° C./min.

[Analysis of Sintered Body]

The relative density of the sintered body obtained was measured by the Archimedean method. The sintered bodies of Examples 1 to 8 were confirmed to have a relative density of 98% or more.

Further, the bulk specific resistance (conductivity) of the sintered body obtained was measured by means of a resistivity meter (Loresta, manufactured by Mitsubishi Chemical Analytech Co., Ltd.) in accordance with the four-probe measurement (JIS R 1637). The results are shown in Table 1. As shown in Table 1, the bulk specific resistances of the sintered bodies of Examples 1 to 8 were 5 mΩcm or less.

For the sintered body obtained, ICP-AES analysis was conducted. As a result, it was confirmed to have the atomic ratio shown in Table 1.

Figure 2:
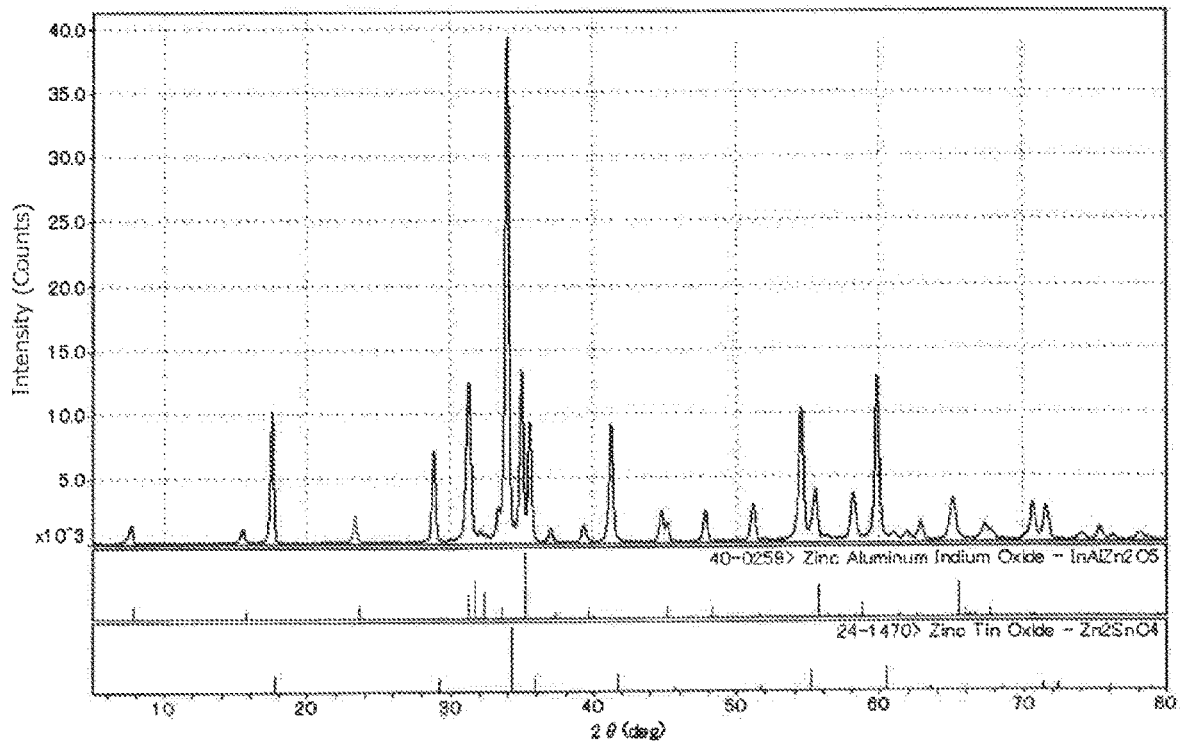
FIG. 2 is a view showing X-ray diffraction charts of a sintered body obtained in Example 1.

Moreover, the crystal structure of the sintered body obtained was determined by means of an X-ray diffraction (XRD) meter. An X-ray diffraction chart of the sintered body obtained in Example 1 is shown in FIG. 2.

As a result of analyzing the chart, a homologous structure of $InAlZn_2O_5$ and a spinel structure of $Zn_2SnO_4$ were observed in the sintered body of Example 1. The crystal structure can be confirmed by using JCPDS (Joint Committee of Powder Diffraction Standards) cards.

As a result of XRD, also in Examples 2 to 8, a homologous structure of $InAlZn_2O_5$ and/or $InAlZnO_4$ and a spinel structure of $Zn_2SnO_4$ were observed. The homologous structure of $InAlZn_2O_5$ corresponds to No. 40-0259 of JCPDS cards and the spinel structure of $Zn_2SnO_4$ corresponds to No. 24-1470 of JCPDS cards. In Example 2, in addition to $InAlZn_2O_5$ and $Zn_2SnO_4$, $InAlZnO_4$ was observed. The homologous structure of $InAlZnO_4$ corresponds to No. 40-0258 of JCPDS cards.

In the sintered bodies of Examples 1 to 8, $In_2O_3$ causing abnormal charge was not observed.

XRD was measured under the following conditions.
Apparatus: Ultima-III manufactured by Rigaku Corporation
X ray: Cu-Kα line (wavelength 1.5406 Å, monochromatized with a graphite monochromator)
2θ-θ reflection method, continuous scanning (1.0°/min.)
sampling interval: 0.02°
slits DS, SS: 2/3°, RS: 0.6 mm For the sintered bodies of Examples 1 to 8, the dispersion of Sn and Al in the sintered body obtained by the electron probe microanalyzer (EPMA) measurement was checked. 8 μm or larger-sized aggregation of Sn or Al was not observed. As a result, the sintered bodies of Examples 1 to 8 were found to be significantly excellent in dispersivity and homogeneousness.

The EPMA measurement was conducted under the following conditions.
Apparatus: JXA-8200 (JEOL Ltd.)
Accelerating voltage: 15 kV
Irradiation current: 50 nA
Irradiation time (per one point): 50 mS

[Production of Sputtering Target]

The surface of the sintered bodies obtained in Examples 1 to 8 was ground by means of a surface grinder. The sides thereof were cut using a diamond cutter. The sintered bodies thus shaped were bonded to a backing plate, thereby to obtain sputtering targets each having a diameter of 4 inches. Further, in Examples 1, 4 and 6, 6 targets each having a width of 200 mm, a length of 1700 mm and a thickness of 10 mm were fabricated for AC sputtering film-forming.

[Confirmation of Presence or Absence of Abnormal Charge]

A sputtering target having a diameter of 4 inches obtained was mounted in a DC sputtering apparatus. As the atmosphere, a mixed gas obtained by adding $H_2O$ gas to argon gas at a partial pressure of 2% was used. A 10 kWh continuous sputtering was conducted at a DC power of 400 W with the sputtering pressure being 0.4 Pa and the substrate temperature being room temperature. The variation in voltage during the sputtering was stored in data logger to confirm the presence or absence of abnormal discharge. The results are shown in Table 1.

The above-mentioned presence or absence of abnormal discharge was determined by detecting abnormal discharge while monitoring the variation in voltage. Specifically, "abnormal discharge" is defined by the case where the voltage variation generated for a measurement time of 5 minutes is 10% or more of the working voltage during sputtering operation. In particular, when the working voltage during a sputtering operation varies within a range of ±10% for 0.1 second, microarcs, which are abnormal discharge during sputtering, may generate, thereby lowering the yield of a device. Accordingly, they may be unsuitable for mass production.

[Confirmation of Presence or Absence of Nodule Generation]

Sputtering was conducted continuously for 40 hours by using a 4-inch-diameter sputtering target obtained with the atmosphere being a mixed gas obtained by adding a hydrogen gas to argon gas at a partial pressure ratio of 3% to confirm the presence or absence of nodule generation. As a result, in the surface of sputtering targets of Examples 1 to 8, no nodules were observed.

The conditions at the time of the sputtering include a sputtering pressure of 0.4 Pa, a DC power of 100 W and a substrate temperature of room temperature. The hydrogen gas was added to the atmosphere gas in order to promote nodule generation.

For evaluation of nodules, the following method was employed. The change in the target surface after sputtering was observed at a magnification of 50 times by means of a stereomicroscope. The number average of nodules having a size of 20 μm or larger generated in the visual field of 3 mm² was calculated. Table 1 shows the number of nodules generated.

Comparative Examples 1 and 2

Sintered bodies and sputtering targets were produced and evaluated in the same manner as in Examples 1 to 8, except that the raw material powders were mixed according to the atomic ratio shown in Table 1, and sintered at a temperature-elevating rate (from 800° C. to a sintering temperature), at a sintering temperature and for a sintering time as shown in Table 1. The results are shown in Table 1.

In the sputtering targets of Comparative Examples 1 and 2, abnormal discharge was occurred during sputtering and nodules were observed on the surface of the target. In the targets of Comparative Examples 1 and 2, a bixbyite structure of $In_2O_3$, a homologous structure of $InAlZn_2O_5$ and $InAlZnO_4$ and a spinel structure of $Zn_2SnO_4$ were observed. The bixbyite structure of $In_2O_3$ can be confirmed by No. 06-0416 of JCPDS cards.

Due to the presence of a bixbyite structure of $In_2O_3$ in targets of Comparative Examples 1 and 2, abnormal grain growth might be occurred in an agglomerated part of $In_2O_3$ during sintering. As a result, air holes might remain, thereby preventing the density of the entire sintered body from increasing.

In the sputtering targets of Comparative Examples 1 and 2, since the temperature-elevating rate (from 800° C. to a sintering temperature) exceeds 2° C./min, the relative density of the target was less than 98% and the bulk resistance exceeded 5 mΩcm.

TABLE 1

|  | In/(In + Sn + Zn + Al) [atomic ratio] | Sn/(In + Sn + Zn + Al) [atomic ratio] | Zn/(In + Sn + Zn + Al) [atomic ratio] | Al/(In + Sn + Zn + Al) [atomic ratio] | Temperature-elevating rate [° C./min] (800° C.-sintering temp.) | Sintering temp. (° C.) |
|---|---|---|---|---|---|---|
| Example 1 | 0.25 | 0.15 | 0.55 | 0.05 | 0.15 | 1400 |
| Example 2 | 0.25 | 0.15 | 0.50 | 0.10 | 0.15 | 1400 |
| Example 3 | 0.30 | 0.10 | 0.50 | 0.10 | 0.15 | 1450 |
| Example 4 | 0.30 | 0.20 | 0.45 | 0.05 | 0.15 | 1450 |
| Example 5 | 0.20 | 0.20 | 0.50 | 0.10 | 0.10 | 1450 |
| Example 6 | 0.25 | 0.10 | 0.60 | 0.05 | 0.15 | 1450 |
| Example 7 | 0.25 | 0.15 | 0.50 | 0.10 | 0.10 | 1450 |
| Example 8 | 0.30 | 0.15 | 0.40 | 0.15 | 0.10 | 1450 |
| Comp. Ex. 1 | 0.50 | 0.05 | 0.10 | 0.35 | 5.5 | 1200 |
| Comp. Ex. 2 | 0.50 | 0.10 | 0.05 | 0.35 | 5.5 | 1200 |

|  | Sintering time (hr) | Generated compound | Relative density (%) | Bulk specific resistance (mΩ cm) | Occurance of abnormal discharge | Number of generated nodules (number/3 mm²) |
|---|---|---|---|---|---|---|
| Example 1 | 15 | $InAlZn_2O_5$ $Zn_2SnO_4$ | 99.2 | 1.8 | None | 0 |
| Example 2 | 15 | $InAlZn_2O_5$ $InAlZnO_4$ $Zn_2SnO_4$ | 98.8 | 2.6 | None | 0 |

TABLE 1-continued

| | | | | | | |
|---|---|---|---|---|---|---|
| Example 3 | 15 | InAlZn$_2$O$_5$ InAlZnO$_4$ Zn$_2$SnO$_4$ | 99.5 | 1.8 | None | 0 |
| Example 4 | 20 | InAlZn$_2$O$_5$ Zn$_2$SnO$_4$ | 99.0 | 2.1 | None | 0 |
| Example 5 | 15 | InAlZn$_2$O$_5$ Zn$_2$SnO$_4$ | 98.8 | 1.5 | None | 0 |
| Example 6 | 15 | InAlZn$_2$O$_5$ Zn$_2$SnO$_4$ | 99.1 | 2.6 | None | 0 |
| Example 7 | 15 | InAlZn$_2$O$_5$ Zn$_2$SnO$_4$ | 99.0 | 2.1 | None | 0 |
| Example 8 | 15 | InAlZn$_2$O$_5$ InAlZnO$_4$ Zn$_2$SnO$_4$ | 98.5 | 1.4 | None | 0 |
| Comp. Ex. 1 | 8 | In$_2$O$_3$ InAlZn$_2$O$_5$ InAlZnO$_4$ Zn$_2$SnO$_4$ | 95.2 | 12.6 | Microarc generated | 3 |
| Comp. Ex. 2 | 8 | In$_2$O$_3$ InAlZn$_2$O$_5$ InAlZnO$_4$ Zn$_2$SnO$_4$ | 96.8 | 11.8 | Microarc generated | 5 |

Examples 9-16

[Formation of Oxide Semiconductor Thin Film]

The 4-inch targets produced in Examples 1 to 8 and shown in Tables 2 and 3 were mounted in a magnetron sputtering apparatus, and slide glass (#1737, manufactured by Corning Inc.) was installed as a substrate. By the DC magnetron sputtering method, a 50 nm-thick amorphous film was formed on the slide glass under the following conditions.

At the time of film formation, an Ar gas, an O$_2$ gas and a H$_2$O gas were introduced at partial pressures (%) shown in Tables 2 and 3. The substrate on which an amorphous film was formed was heated in an atmosphere at 300° C. for 60 minutes, whereby an oxide semiconductor thin film was formed.

Sputtering conditions were as follows.
Substrate temperature: 25° C.
Ultimate pressure: 8.5×10$^{-5}$ Pa
Atmospheric gas: Ar gas, O$_2$ gas, H$_2$O gas (for partial pressure, see Table 2)
Sputtering pressure (total pressure): 0.4 Pa
Input power: DC 100 W
S (substrate)–T (target) distance: 70 mm

[Evaluation of Oxide Semiconductor Thin Film]

A glass substrate on which an oxide semiconductor film was formed was set in a Resi Test 8300 (manufactured by TOYO Corporation), and the Hall effect was evaluated at room temperature. Further, by the ICP-AES analysis, it was confirmed that the atomic ratio of each element contained in the oxide thin film was the same as that of the sputtering target.

The crystal structure was examined by means of an X-ray diffraction measurement apparatus (Ultima-III, manufactured by Rigaku Corporation).

In Examples 9 to 16, no diffraction peaks were observed immediately after the deposition of the thin film, and hence it was confirmed that the thin film was amorphous. After conducting a heat treatment (annealing) in the air at 300° C. for 60 minutes, no diffraction peaks were observed, and the thin film was confirmed to be amorphous.

The measuring conditions of the X-ray diffraction measurement (XRD) are as follows.
Apparatus: Ultima-III, manufactured by Rigaku Corporation
X rays: Cu-Kα rays (wavelength: 1.5406 Å, monochromatized by means of a graphite monochrometer)
2θ-θ reflection method, continuous scanning (1.0°/min)
Sampling interval: 0.02°
Slit DS, SS: 2/3°, RS: 0.6 mm

[Production of Thin Film Transistor]

As a substrate, a conductive silicon substrate provided with a 100 nm-thick thermally oxidized film was used. The thermally oxidized film functioned as a gate insulating film and the conductive silicon part functioned as a gate electrode.

On the gate insulating film, a film was formed by sputtering under the conditions shown in Tables 2 and 3, whereby a 50 nm-thick amorphous thin film was fabricated. As a resist, OFPR#800 (manufactured by Tokyo Ohka Kogyo Co., Ltd.) was used. Coating, pre-baking (80° C., 5 minutes) and exposure were conducted. After development, post-baking (120° C., 5 minutes), etching with oxalic acid, and patterning into a desired shape were conducted. Thereafter, the film was subjected to a heat treatment at 300° C. for 60 minutes in a hot-air oven (annealing treatment).

Thereafter, Mo (100 nm) was formed into a film by sputtering, and source/drain electrodes were patterned by the lift-off process in a desired shape. As shown in Tables 2 and 3, as a pretreatment before forming a protective film, an oxide semiconductor film was subjected to a nitrous oxide plasma treatment. Further, SiO$_x$ was formed into a film by the plasma CVD (PECVD) method to obtain a protective film. A contact hole was formed by using hydrofluoric acid, whereby a thin film transistor was fabricated.

For the thus fabricated thin film transistor, a field effect mobility (μ), an S value and a threshold voltage (Vth) were evaluated. The results are shown in Tables 2 and 3.

These characteristic values were measured by using a semiconductor parameter analyzer (4200SCS, manufactured by Keithley Instruments, Inc.) at room temperature in a light-shielding (in a shield box) environment.

For the produced transistor, transmission properties were evaluated with the drain voltage (Vd) and the gate voltage (Vg) being 1V and −15 to 20V, respectively.

The field effect mobility (μ) was calculated from the linear mobility, and defined as the maximum value of Vg-μ.

For the fabricated thin film transistor, a DC bias stress test was conducted. Tables 2 and 3 show a change in TFT transfer characteristics before and after application of a DC stress of Vg=15V and Vd=15V (stress temperature: 80° C. or less) for 10000 seconds.

It was revealed that the thin film transistor in Examples 9 to 16 suffered only a slight change in threshold voltage, i.e. it was hardly affected by a DC stress.

Comparative Examples 3 and 4

By using the 4-inch targets fabricated in Comparative Examples 1 and 2, oxide semiconductor thin films and thin film transistors were fabricated and evaluated in the same manner as in Examples 9 to 16 in accordance with the sputtering, heating (annealing) conditions and a pretreatment for forming a protective film shown in Table 3. The results are shown in Table 3.

As shown in Tables 2 and 3, the devices of Comparative Examples 3 and 4 had a field effect mobility of less than 15 cm$^2$/Vs, which was significantly lower than those in Examples 9 to 16. In the thin film transistors in Comparative Examples 3 and 4, as a result of the DC bias stress test, the threshold voltage was varied by 1V or more, showing that it underwent significant deterioration of characteristics.

TABLE 2

| | | Example 9 | Example 10 | Example 11 | Example 12 | Example 13 |
|---|---|---|---|---|---|---|
| | Target composition | In/(In + Sn + Zn + Al) = 0.25 Sn/(In + Sn + Zn + Al) = 0.15 Zn/(In + Sn + Zn + Al) = 0.55 Al/(In + Sn + Zn + Al) = 0.05 | In/(In + Sn + Zn + Al) = 0.25 Sn/(In + Sn + Zn + Al) = 0.15 Zn/(In + Sn + Zn + Al) = 0.50 Al/(In + Sn + Zn + Al) = 0.10 | In/(In + Sn + Zn + Al) = 0.30 Sn/(In + Sn + Zn + Al) = 0.10 Zn/(In + Sn + Zn + Al) = 0.50 Al/(In + Sn + Zn + Al) = 0.10 | In/(In + Sn + Zn + Al) = 0.30 Sn/(In + Sn + Zn + Al) = 0.20 Zn/(In + Sn + Zn + Al) = 0.45 Al/(In + Sn + Zn + Al) = 0.05 | In/(In + Sn + Zn + Al) = 0.20 Sn/(In + Sn + Zn + Al) = 0.20 Zn/(In + Sn + Zn + Al) = 0.50 Al/(In + Sn + Zn + Al) = 0.10 |
| Sputtering Conditions | Ultimate pressure (Pa) | 8.5 × 10$^{-5}$ | 8.5 × 10$^{-5}$ | 8.5 × 10$^{-5}$ | 8.5 × 10$^{-5}$ | 8.5 × 10$^{-5}$ |
| | Sputtering pressure (Pa) | 0.4 | 0.4 | 0.4 | 0.4 | 0.4 |
| | [H$_2$O]/([H$_2$O] + [Ar] + [O$_2$]) (%) | 0 | 1 | 1 | 0 | 0 |
| | [Ar]/([H$_2$O] + [Ar] + [O$_2$]) (%) | 95 | 94 | 94 | 90 | 95 |
| | [O$_2$]/([H$_2$O] + [Ar] + [O$_2$]) (%) | 5 | 5 | 5 | 10 | 5 |
| | Water partial pressure (Pa) | 0.0E+00 | 4.0E-03 | 4.0E-03 | 0.0E+00 | 0.0E+00 |
| | Sputtering method | DC | DC | DC | DC | DC |
| | T-S distance (mm) | 70 | 70 | 70 | 70 | 70 |
| | Film thickness (nm) | 50 | 50 | 50 | 50 | 50 |
| | Substrate temperature (° C.) | 25 | 25 | 25 | 25 | 25 |
| Annealing | Annealing temperature (° C.) | 300 | 300 | 300 | 300 | 300 |
| | Annealing time (min) | 60 | 60 | 60 | 60 | 60 |
| | Atmosphere | Air | Air | Air | Air | Air |
| Hall Measurement | Carrier concentration (cm$^{-3}$) | 3.79E+17 | 9.65E+16 | 1.19E+17 | 2.81E+17 | 1.12E+17 |
| TFT | Channel width/Channel length (μm) | 20/10 | 20/10 | 20/10 | 20/10 | 20/10 |
| | Source/Drain | Mo | Mo | Mo | Mo | Mo |
| | Source/Drain patterning | Lift off | Lift off | Lift off | Lift off | Lift off |
| | Pretreament for formation of protective film | Nitrous oxide plasma | Nitrous oxide plasma | Nitrous oxide plasma | Nitrous oxide plasma | Nitrous oxide plasma |
| | Protective film | SiOx | SiOx | SiOx | SiOx | SiOx |
| | Mobility (cm$^2$/Vs) | 23.8 | 20.2 | 21.8 | 23.4 | 21.3 |
| | Threshold voltage Vth (V) | 2.1 | 1.8 | 1.3 | 1.3 | 0.49 |
| | S value (V/dec) | 0.12 | 0.23 | 0.12 | 0.12 | 0.17 |
| | Shift in threshold voltage ⊿Vth (V) | 0.18 | 0.26 | 0.16 | 0.15 | 0.22 |

TABLE 3

| | | Example 14 | Example 15 | Example 16 | Comp. Ex. 3 | Comp. Ex. 4 |
|---|---|---|---|---|---|---|
| | Target composition | In/(In + Sn + Zn + Al) = 0.25 Sn/(In + Sn + Zn + Al) = 0.10 Zn/(In + Sn + Zn + Al) = 0.60 Al/(In + Sn + Zn + Al) = 0.05 | In/(In + Sn + Zn + Al) = 0.25 Sn/(In + Sn + Zn + Al) = 0.15 Zn/(In + Sn + Zn + Al) = 0.50 Al/(In + Sn + Zn + Al) = 0.10 | In/(In + Sn + Zn + Al) = 0.30 Sn/(In + Sn + Zn + Al) = 0.15 Zn/(In + Sn + Zn + Al) = 0.40 Al/(In + Sn + Zn + Al) = 0.15 | In/(In + Sn + Zn + Al) = 0.50 Sn/(In + Sn + Zn + Al) = 0.05 Zn/(In + Sn + Zn + Al) = 0.10 Al/(In + Sn + Zn + Al) = 0.35 | In/(In + Sn + Zn + Al) = 0.50 Sn/(In + Sn + Zn + Al) = 0.10 Zn/(In + Sn + Zn + Al) = 0.05 Al/(In + Sn + Zn + Al) = 0.35 |
| Sputtering Conditions | Ultimate pressure (Pa) | 8.5 × 10$^{-5}$ | 8.5 × 10$^{-5}$ | 8.5 × 10$^{-5}$ | 8.5 × 10$^{-5}$ | 8.5 × 10$^{-5}$ |
| | Sputtering pressure (Pa) | 0.4 | 0.4 | 0.4 | 0.4 | 0.4 |
| | [H$_2$O]/([H$_2$O] + [Ar] + [O$_2$]) (%) | 2 | 0 | 1 | 0 | 0 |
| | [Ar]/([H$_2$O] + [Ar] + [O$_2$]) (%) | 98 | 90 | 94 | 50 | 60 |
| | [O$_2$]/([H$_2$O] + [Ar] + [O$_2$]) (%) | 0 | 10 | 5 | 50 | 40 |
| | Water partial pressure (Pa) | 8.0E-03 | 0.0E+00 | 4.0E-03 | 0.0E+00 | 0.0E+00 |
| | Sputtering method | DC | DC | DC | DC | DC |
| | T-S distance (mm) | 70 | 70 | 70 | 70 | 70 |
| | Film thickness (nm) | 50 | 50 | 50 | 50 | 50 |
| | Substrate temperature (° C.) | 25 | 25 | 25 | 25 | 25 |
| Annealing | Annealing temperature (° C.) | 300 | 300 | 300 | 300 | 300 |
| | Annealing time (min) | 60 | 60 | 60 | 60 | 60 |
| | Atmosphere | Air | Air | Air | Air | Air |

TABLE 3-continued

|  |  | Example 14 | Example 15 | Example 16 | Comp. Ex. 3 | Comp. Ex. 4 |
|---|---|---|---|---|---|---|
| Hall Measurement | Carrier concentration ($cm^{-3}$) | 3.63E+17 | 2.73E+17 | 8.68E+16 | 5.64E+16 | 4.95E+16 |
| TFT | Channel width/Channel length (μm) | 20/10 | 20/10 | 20/10 | 20/10 | 20/10 |
|  | Source/Drain | Mo | Mo | Mo | Mo | Mo |
|  | Source/Drain patterning | Lift off | Lift off | Lift off | Lift off | Lift off |
|  | Pretreament for formation of protective film | Nitrous oxide plasma | Nitrous oxide plasma | Nitrous oxide plasma | No treatment | No treatment |
|  | Protective film | SiOx | SiOx | SiOx | SiOx | SiOx |
|  | Mobility ($cm^2$/Vs) | 27.4 | 20.3 | 20.6 | 10.4 | 9.7 |
|  | Threshold voltage Vth (V) | 1.6 | 0.41 | 3.8 | 2.6 | 2.8 |
|  | S value (V/dec) | 0.15 | 0.17 | 0.32 | 0.38 | 0.36 |
|  | shift in threhold voltage $\Delta$ Vth (V) | 0.36 | 0.30 | 0.24 | 1.3 | 1.1 |

Examples 17 to 19

In accordance with the sputtering conditions and annealing conditions shown in Table 4, the oxide semiconductor thin film and the thin film transistor were fabricated and evaluated in the same manner as in Examples 9 to 16. The results are shown in Table 4. In Examples 17 to 19, AC sputtering was conducted instead of DC sputtering to form a film.

As the AC sputtering, the apparatus as shown in FIG. 1 (disclosed in JP-A-2005-290550) was used.

For example, in Example 17, 6 targets 31a to 31f (each having a width of 200 mm, a length of 1700 mm and a thickness of 10 mm) fabricated in Example 1 were used. These targets 31a to 31f were arranged parallel to the direction of the width of a substrate such that they remote from each other with an interval of 2 mm. The width of the magnetic field forming means 40a to 40f was 200 mm as in the case of targets 31a to 31f.

From the gas supply system, Ar and $H_2O$ as the sputtering gas were respectively introduced into the system. The sputtering conditions were as follows. Sputtering pressure: 0.5 Pa, AC source power: 3 W/$cm^2$ (=10.2 kW/3400 $cm^2$), and frequency: 10 kHz. Under the above-mentioned conditions, film formation was conducted for 10 seconds. The film thickness of the resulting thin film was measured and found to be 12 nm. The film formation speed was as high as 72 nm/min, which was suited to mass production.

The glass substrate on which a thin film had been formed, and subjected to a heat treatment in the air at 300° C. for 60 minutes (in the atmosphere). The thin film was cut into a size of 1 $cm^2$, and then subjected to a Hall effect treatment by the four probe method. As a result, the carrier concentration was 2.62×$10^{17}$ $cm^{-3}$, indicating that the film became a sufficient semiconductor. As a result of an XRD measurement, it was confirmed that the oxide thin film was amorphous immediately after the thin film deposition, and was still amorphous after allowing it to stand in the air at 300° C. for 60 minutes. Also, by the ICP-AES analysis, it was confirmed that the atomic ratio of each element contained in the oxide thin film was the same as that of the sputtering target.

In Examples 18 and 19, the targets prepared in Examples 4 and 6 were respectively used instead of the target prepared in Example 1.

Comparative Example 5

In accordance with the sputtering and annealing conditions shown in Table 4, the oxide semiconductor thin film and thin film transistor were fabricated and evaluated in the same manner as in Examples 17 to 19, except that, instead of the targets used in Examples 1, 4 and 6, the target prepared in Comparative Example 1 was used. The results are shown in Table 4.

As shown in Table 4, the device of Comparative Example 5 had a field effect mobility of less than 15 $cm^2$/Vs, which was significantly lower than those in Examples 17 to 19.

TABLE 4

|  |  | Example 17 | Example 18 | Example 19 | Comp. Ex. 5 |
|---|---|---|---|---|---|
|  | Target composition | In/(In + Sn + Zn + Al) = 0.25<br>Sn/(In + Sn + Zn + Al) = 0.15<br>Zn/(In + Sn + Zn + Al) = 0.55<br>Al/(In + Sn + Zn + Al) = 0.05 | In/(In + Sn + Zn + Al) = 0.30<br>Sn/(In + Sn + Zn + Al) = 0.20<br>Zn/(In + Sn + Zn + Al) = 0.45<br>Al/(In + Sn + Zn + Al) = 0.05 | In/(In + Sn + Zn + Al) = 0.25<br>Sn/(In + Sn + Zn + Al) = 0.10<br>Zn/(In + Sn + Zn + Al) = 0.60<br>Al/(In + Sn + Zn + Al) = 0.05 | In/(In + Sn + Zn + Al) = 0.50<br>Sn/(In + Sn + Zn + Al) = 0.05<br>Zn/(In + Sn + Zn + Al) = 0.10<br>Al/(In + Sn + Zn + Al) = 0.35 |
| Sputtering conditions | Ultimate pressure (Pa) | 5.0 × $10^{-5}$ | 5.0 × $10^{-5}$ | 5.0 × $10^{-5}$ | 5.0 × $10^{-5}$ |
|  | Sputtering pressure (Pa) | 0.5 | 0.65 | 0.5 | 1.0 |
|  | [$H_2O$]/([$H_2O$] + [Ar] + [$O_2$]) (%) | 0 | 1 | 1 | 0 |
|  | [Ar]/([$H_2O$] + [Ar] + [$O_2$]) (%) | 95 | 94 | 89 | 50 |
|  | [$O_2$]/([$H_2O$] + [Ar] + [$O_2$]) (%) | 5 | 5 | 10 | 50 |
|  | Water partial pressure (Pa) | 0 | 0.0065 | 0.005 | 0 |
|  | Sputtering method | AC | AC | AC | AC |
|  | AC power density (W/$cm^2$) | 3 | 5 | 5 | 5 |
|  | AC frequency (Hz) | 10k | 20k | 500k | 500k |
|  | Film thickness (nm) | 50 | 50 | 35 | 50 |
|  | Substrate temperature (° C.) | RT | 80 | 80 | 80 |

TABLE 4-continued

|  |  | Example 17 | Example 18 | Example 19 | Comp. Ex. 5 |
|---|---|---|---|---|---|
|  | Target composition | $In/(In + Sn + Zn + Al) = 0.25$<br>$Sn/(In + Sn + Zn + Al) = 0.15$<br>$Zn/(In + Sn + Zn + Al) = 0.55$<br>$Al/(In + Sn + Zn + Al) = 0.05$ | $In/(In + Sn + Zn + Al) = 0.30$<br>$Sn/(In + Sn + Zn + Al) = 0.20$<br>$Zn/(In + Sn + Zn + Al) = 0.45$<br>$Al/(In + Sn + Zn + Al) = 0.05$ | $In/(In + Sn + Zn + Al) = 0.25$<br>$Sn/(In + Sn + Zn + Al) = 0.10$<br>$Zn/(In + Sn + Zn + Al) = 0.60$<br>$Al/(In + Sn + Zn + Al) = 0.05$ | $In/(In + Sn + Zn + Al) = 0.50$<br>$Sn/(In + Sn + Zn + Al) = 0.05$<br>$Zn/(In + Sn + Zn + Al) = 0.10$<br>$Al/(In + Sn + Zn + Al) = 0.35$ |
| Annealing | Annealing temperature (° C.) | 300 | 300 | 300 | 300 |
|  | Annealing time (min) | 60 | 60 | 60 | 60 |
|  | Atmosphere | Air | Air | Air | Air |
| Hall measurement | Carrier concentration ($cm^3$) | 2.62E+17 | 3.73E+17 | 1.62E+17 | 4.71E+16 |
| TFT | Channel width/Channel length (μm) | 20/5 | 20/5 | 20/5 | 20/5 |
|  | Source/drain | Mo | Mo | Mo | Mo |
|  | Source/drain patterning | Dry etching | Dry etching | Dry etching | Dry etching |
|  | Protective film | SiOx | SiOx | SiOx | SiOx |
|  | Mobility ($cm^2/Vs$) | 22.9 | 20.5 | 22.6 | 7.4 |
|  | Threshold voltage (V) | 2.3 | 2.8 | 2.1 | 4.8 |
|  | S value (V/dec) | 0.18 | 0.11 | 0.18 | 0.33 |

Examples 20 to 29

[Production of a Thin Film Transistor]

As the substrate, a conductive silicon substrate with a thermally oxidized film with a thickness of 100 nm was used. The thermally oxidized film functioned as a gate insulating film, and the conductive silicon part functioned as a gate electrode. The conductive silicon substrate with a thermally oxidized film was washed with an aqueous HCN solution (washing liquid) having an extremely low concentration (1 ppm) and a pH of 10. The washing was conducted while setting the temperature to 30° C.

As Examples 20 to 29, the targets prepared in Examples 1 to 8, 1 and 2 were used. On the gate insulating film, a 50 nm-thick amorphous film was formed by sputtering under the sputtering and annealing conditions shown in Tables 5 and 6. As a resist, OFPR#800 (manufactured by Tokyo Ohka Kogyo Co., Ltd.) was used. Coating, pre-baking (80° C., 5 minutes) and exposure were conducted. After development, post-baking (120° C., 5 minutes), etching with oxalic acid, and patterning into a desired shape were conducted. Thereafter, for the devices in Examples 20 to 26, the film was subjected to a heat treatment at 450° C. for 60 minutes in a hot-air oven (annealing treatment). For the devices in Examples 27 to 29, the heating treatment (annealing treatment) was conducted at 300° C. for 60 minutes in a hot-air oven.

Thereafter, Mo (200 nm) was formed into a film by sputtering. The source/drain electrode was patterned into a desired shape by channel etching. Thereafter, as shown in Tables 5 and 6, as a pretreatment for forming a protective film, a nitrous oxide plasma treatment was conducted for an oxide semiconductor film. An $SiO_x$ was formed into a film by the plasma CVD (PECVD) method to obtain a protective film. A contact hole was formed by using hydrofluoric acid, whereby a back-channel etch type thin film transistor was fabricated.

For the channel layer of the thin film transistor provided with the protective film, evaluation of crystalline properties was conducted by an electron beam diffraction pattern by a cross-sectional TEM (Transmission Electron Microscope). As the apparatus, HF-2100 (field emission-type transmission electron microscope manufactured by Hitachi, Ltd.) was used.

A cross-sectional TEM analysis was conducted for the channel layer of the devices in Examples 20 to 26. No diffraction pattern was observed in the front channel side, showing that it was amorphous. A diffraction pattern was observed in part of the back channel side, showing that a crystallized region was present in the back channel side. On the other hand, as for the devices in Examples 27 to 29, no diffraction patterns were observed in both of the front channel side and the back channel side, showing that it was amorphous.

For the produced transistor, transfer properties were evaluated with the drain voltage (Vd) and the gate voltage (Vg) being 1V and −15 to 20V, respectively. The results are shown in Tables 5 and 6.

The field effect mobility (μ) was calculated from the linear mobility, and defined as the maximum value of Vg-μ.

For the fabricated thin film transistor, a DC bias stress test was conducted. Tables 5 and 6 show a change in TFT transfer characteristics before and after application of a DC stress of Vg=15V and Vd=15V (stress temperature: 80° C. or less) for 10000 seconds.

It was revealed that the thin film transistor in Examples 20 to 29 suffered only a slight change in threshold voltage, i.e. it was hardly affected by a DC stress.

Comparative Examples 6 and 7

In Comparative Examples 6 and 7, a conductive silicon substrate provided with a thermally oxidized film was used as in the case of Examples 20 to 29. However, in Comparative Examples 6 and 7, washing with an aqueous HCN solution (washing solution) was not conducted.

By using the targets prepared in Comparative Examples 1 and 2, in accordance with the sputtering conditions and annealing conditions shown in Table 6, a back channel etch thin film transistor was prepared and evaluated in the same manner as in Examples 20 to 29, except that the nitrous oxide plasma treatment was not conducted for the channel. The results are shown in Table 6.

As shown in Tables 5 and 6, the back channel etch type thin film transistors of Comparative Examples 6 and 7 had a field effect mobility of less than 15 cm²/Vs, that was significantly lower than the back channel etch type thin film transistors in Examples 20 to 29.

A cross-sectional TEM analysis was conducted for the channel layer of the devices in Comparative Examples 6 and 7. No diffraction pattern was observed both in the front channel side and the back channel side, showing that it was amorphous.

TABLE 5

| | | Example 20 | Example 21 | Example 22 | Example 23 | Example 24 |
|---|---|---|---|---|---|---|
| | Target composition | In/(In + Sn + Zn + Al) = 0.25 Sn/(In + Sn + Zn + Al) = 0.15 Zn/(In + Sn + Zn + Al) = 0.55 Al/(In + Sn + Zn + Al) = 0.05 | In/(In + Sn + Zn + Al) = 0.25 Sn/(In + Sn + Zn + Al) = 0.15 Zn/(In + Sn + Zn + Al) = 0.50 Al/(In + Sn + Zn + Al) = 0.10 | In/(In + Sn + Zn + Al) = 0.30 Sn/(In + Sn + Zn + Al) = 0.10 Zn/(In + Sn + Zn + Al) = 0.50 Al/(In + Sn + Zn + Al) = 0.10 | In/(In + Sn + Zn + Al) = 0.30 Sn/(In + Sn + Zn + Al) = 0.20 Zn/(In + Sn + Zn + Al) = 0.45 Al/(In + Sn + Zn + Al) = 0.05 | In/(In + Sn + Zn + Al) = 0.20 Sn/(In + Sn + Zn + Al) = 0.20 Zn/(In + Sn + Zn + Al) = 0.50 Al/(In + Sn + Zn + Al) = 0.10 |
| Sputtering Conditions | Ultimate pressure (Pa) | $8.5 \times 10^{-5}$ | $8.5 \times 10^{-5}$ | $8.5 \times 10^{-5}$ | $8.5 \times 10^{-5}$ | $8.5 \times 10^{-5}$ |
| | Sputtering presssure (Pa) | 0.4 | 0.4 | 0.4 | 0.4 | 0.4 |
| | [H₂O]/([H₂O] + [Ar] + [O₂]) (%) | 1 | 0 | 2 | 1 | 0 |
| | [Ar]/([H₂O] + [Ar] + [O₂]) (%) | 96 | 95 | 98 | 94 | 93 |
| | [O₂]/([H₂O] + [Ar] + [O₂]) (%) | 3 | 5 | 0 | 5 | 7 |
| | Water partial pressure (Pa) | 4.0E−03 | 0.0E+00 | 8.0E−03 | 4.0E−03 | 0.0E+00 |
| | Sputtering method | DC | DC | DC | DC | DC |
| | T-S distance (mm) | 70 | 70 | 70 | 70 | 70 |
| | Film thickness (nm) | 50 | 50 | 50 | 50 | 50 |
| | Substrate temperature (° C.) | 25 | 25 | 25 | 25 | 25 |
| Annealing | Annealing temperature (° C.) | 450 | 450 | 450 | 450 | 450 |
| | Annealing time (min) | 60 | 60 | 60 | 60 | 60 |
| | Atmosphere | Air | Air | Air | Air | Air |
| TFT | Channel width/Channel length (μm) | 20/10 | 20/10 | 20/10 | 20/10 | 20/10 |
| | Source/Drain | Mo | Mo | Mo | Mo | Mo |
| | Source/Drain patterning | Channel etching | Channel etching | Channel etching | Channel etching | Channel etching |
| | Pretreatment for forming protective film | Nitrous oxide plasma | Nitrous oxide plasma | Nitrous oxide plasma | Nitrous oxide plasma | Nitrous oxide plasma |
| | Protective film | SiOx | SiOx | SiOx | SiOx | SiOx |
| | Mobility (cm²/Vs) | 19.6 | 15.8 | 16.3 | 16.7 | 15.2 |
| | Threshold voltage Vth (V) | 1.3 | 2.5 | 2.0 | 1.4 | 2.8 |
| | S value (V/dec) | 0.19 | 0.21 | 0.16 | 0.22 | 0.15 |
| | Shift in threshold voltage Δ Vth (V) | 0.16 | 0.17 | 0.19 | 0.16 | 0.19 |

TABLE 6

| | | Example 25 | Example 26 | Example 27 | Example 28 |
|---|---|---|---|---|---|
| | Target composition | In/(In + Sn + Zn + Al) = 0.25 Sn/(In + Sn + Zn + Al) = 0.10 Zn/(In + Sn + Zn + Al) = 0.60 Al/(In + Sn + Zn + Al) = 0.05 | In/(In + Sn + Zn + Al) = 0.25 Sn/(In + Sn + Zn + Al) = 0.15 Zn/(In + Sn + Zn + Al) = 0.50 Al/(In + Sn + Zn + Al) = 0.10 | In/(In + Sn + Zn + Al) = 0.30 Sn/(In + Sn + Zn + Al) = 0.15 Zn/(In + Sn + Zn + Al) = 0.40 Al/(In + Sn + Zn + Al) = 0.15 | In/(In + Sn + Zn + Al) = 0.25 Sn/(In + Sn + Zn + Al) = 0.15 Zn/(In + Sn + Zn + Al) = 0.55 Al/(In + Sn + Zn + Al) = 0.05 |
| Sputtering Conditions | Ultimate pressure (Pa) | $8.5 \times 10^{-5}$ | $8.5 \times 10^{-5}$ | $8.5 \times 10^{-5}$ | $8.5 \times 10^{-5}$ |
| | Sputtering pressure (Pa) | 0.4 | 0.4 | 0.4 | 0.4 |
| | [H₂O]/([H₂O] + [Ar] + [O₂]) (%) | 1 | 1 | 2 | 0 |
| | [Ar]/([H₂O] + [Ar] + [O₂]) (%) | 94 | 94 | 98 | 90 |
| | [O₂]/([H₂O] + [Ar] + [O₂]) (%) | 5 | 5 | 0 | 10 |
| | Water partial pressure (Pa) | 4.0E−03 | 4.0E−03 | 8.0E−03 | 0.0E+00 |
| | Sputtering method | DC | DC | DC | DC |
| | T-S distance (mm) | 70 | 70 | 70 | 70 |
| | Film thickness (nm) | 50 | 50 | 50 | 50 |
| | Substrate temperature (° C.) | 25 | 25 | 25 | 25 |
| Annealing | Annealing temperature (° C.) | 450 | 450 | 300 | 300 |
| | Annealing time (min) | 60 | 60 | 60 | 60 |
| | Atmosphere | Air | Air | Air | Air |
| TFT | Channel width/Channel length (μm) | 20/10 | 20/10 | 20/10 | 20/10 |
| | Source/drain | Mo | Mo | Mo | Mo |
| | Source/drain patterning | Channel etching | Channel etching | Channel etching | Channel etching |
| | Pretreatment for forming protective film | Nitrous oxide plasma | Nitrous oxide plasma | Nitrous oxide plasma | Nitrous oxide plasma |
| | Protective film | SiOx | SiOx | SiOx | SiOx |
| | Mobility (cm²/Vs) | 17.1 | 15.1 | 18.0 | 24.7 |
| | Threshold voltage Vth (V) | 1.2 | 2.3 | 1.3 | 1.4 |

TABLE 6-continued

| | | | | |
|---|---|---|---|---|
| S value (V/dec) | 0.18 | 0.17 | 0.26 | 0.25 |
| Shift in threshold voltage $\Delta$ Vth (V) | 0.16 | 0.13 | 0.27 | 0.22 |

| | | Example 29 | Comp. Ex. 5 | Comp. Ex. 6 |
|---|---|---|---|---|
| | Target composition | In/(In + Sn + Zn + Al) = 0.25 Sn/(In + Sn + Zn + Al) = 0.15 Zn/(In + Sn + Zn + Al) = 0.50 Al/(In + Sn + Zn + Al) = 0.10 | In/(In + Sn + Zn + Al) = 0.50 Sn/(In + Sn + Zn + Al) = 0.05 Zn/(In + Sn + Zn + Al) = 0.10 Al/(In + Sn + Zn + Al) = 0.35 | In/(In + Sn + Zn + Al) = 0.50 Sn/(In + Sn + Zn + Al) = 0.10 Zn/(In + Sn + Zn + Al) = 0.05 Al/(In + Sn + Zn + Al) = 0.35 |
| Sputtering Conditions | Ultimate pressure (Pa) | $8.5 \times 10^{-5}$ | $8.5 \times 10^{-5}$ | $8.5 \times 10^{-5}$ |
| | Sputtering pressure (Pa) | 0.4 | 0.4 | 0.4 |
| | [H$_2$O]/([H$_2$O] + [Ar] + [O$_2$]) (%) | 0 | 0 | 0 |
| | [Ar]/([H$_2$O] + [Ar] + [O$_2$]) (%) | 90 | 50 | 60 |
| | [O$_2$]/([H$_2$O] + [Ar] + [O$_2$]) (%) | 10 | 50 | 40 |
| | Water partial pressure (Pa) | 0.0E+00 | 0.0E+00 | 0.0E+00 |
| | Sputtering method | DC | DC | DC |
| | T-S distance (mm) | 70 | 70 | 70 |
| | Film thickness (nm) | 50 | 50 | 50 |
| | Substrate temperature (° C.) | 25 | 25 | 25 |
| Annealing | Annealing temperature (° C.) | 300 | 300 | 300 |
| | Annealing time (min) | 60 | 60 | 60 |
| | Atmosphere | Air | Air | Air |
| TFT | Channel width/Channel length (μm) | 20/11 | 20/10 | 20/10 |
| | Source/drain | Mo | Mo | Mo |
| | Source/drain patterning | Channel etching | Channel etching | Channel etching |
| | Pretreatment for forming protective film | Nitrous oxide plasma | No treatment | No treatment |
| | Protective film | SiOx | SiOx | SiOx |
| | Mobility (cm$^2$/Vs) | 16.1 | 8.3 | 6.5 |
| | Threshold voltage Vth (V) | 1.7 | 3.5 | 2.9 |
| | S value (V/dec) | 0.12 | 0.49 | 0.41 |
| | Shift in threshold voltage $\Delta$ Vth (V) | 0.20 | 2.7 | 2.3 |

INDUSTRIAL APPLICABILITY

The thin film transistor obtained by using the sputtering target of the invention can be used as a display, in particular, as a large-area display.

Although only some exemplary embodiments and/or examples of the invention have been described in detail above, those skilled in the art will readily appreciate that many modifications are possible in the exemplary embodiments and/or examples without materially departing from the novel teachings and advantages of the invention. Accordingly, all such modifications are intended to be included within the scope of the invention.

The specification of the Japanese patent application to which the present application claims priority under the Paris Convention are incorporated herein by reference in their entirety.

The invention claimed is:

1. An oxide semiconductor thin film formed by a sputtering method using a sputtering target in an atmosphere of a mixed gas that comprises: one or more selected from water molecules, oxygen molecules and nitrous oxide molecules; and further comprises rare gas atoms wherein the sputtering target that comprises indium, tin, zinc and aluminum, in an atomic ratio that satisfies the following formulas (1) to (4):

$$0.10 \leq \text{In}/(\text{In}+\text{Sn}+\text{Zn}+\text{Al}) \leq 0.60 \quad (1)$$

$$0.01 \leq \text{Sn}/(\text{In}+\text{Sn}+\text{Zn}+\text{Al}) \leq 0.30 \quad (2)$$

$$0.10 \leq \text{Zn}/(\text{In}+\text{Sn}+\text{Zn}+\text{Al}) \leq 0.65 \quad (3)$$

$$0.01 \leq \text{Al}/(\text{In}+\text{Sn}+\text{Zn}+\text{Al}) \leq 0.30 \quad (4)$$

wherein the sputtering target comprises a homologous structure compound represented by InAlO$_3$(ZnO)$_m$, where m is 0.1 to 10.

2. The oxide semiconductor thin film according to claim 1, wherein the atomic ratio of the sputtering target satisfies the following formulas (1) to (4):

$$0.10 \leq \text{In}/(\text{In}+\text{Sn}+\text{Zn}+\text{Al}) \leq 0.60 \quad (1)$$

$$0.01 \leq \text{Sn}/(\text{In}+\text{Sn}+\text{Zn}+\text{Al}) \leq 0.25 \quad (2)$$

$$0.10 \leq \text{Zn}/(\text{In}+\text{Sn}+\text{Zn}+\text{Al}) \leq 0.55 \quad (3)$$

$$0.01 \leq \text{Al}/(\text{In}+\text{Sn}+\text{Zn}+\text{Al}) \leq 0.30 \quad (4).$$

3. The oxide semiconductor thin film according to claim 1, wherein the atomic ratio of the sputtering target satisfies the following formulas (1) to (4):

$$0.20 \leq \text{In}/(\text{In}+\text{Sn}+\text{Zn}+\text{Al}) \leq 0.60 \quad (1)$$

$$0.01 \leq \text{Sn}/(\text{In}+\text{Sn}+\text{Zn}+\text{Al}) \leq 0.25 \quad (2)$$

$$0.10 \leq \text{Zn}/(\text{In}+\text{Sn}+\text{Zn}+\text{Al}) \leq 0.55 \quad (3)$$

$$0.01 \leq \text{Al}/(\text{In}+\text{Sn}+\text{Zn}+\text{Al}) \leq 0.30 \quad (4).$$

4. A thin film transistor comprising, as a channel layer, the oxide semiconductor thin film according to claim 1.

5. A display comprising the thin film transistor according to claim 4.

6. The oxide semiconductor thin film according to claim 1, wherein the sputtering target comprises a spinel structure compound represented by Zn$_2$SnO$_4$.

7. The oxide semiconductor thin film according to claim 1, wherein the sputtering target is formed by a method comprising
　　elevating a temperature of a formed body of an oxide comprising an indium element, a tin element, a zinc element, and an aluminum element from 800° C. to a sintering temperature and retaining the sintering temperature for 10 to 50 hours.

8. The oxide semiconductor thin film according to claim 7 wherein the sintering temperature is 1200° C. to 1650° C.

9. The oxide semiconductor thin film according to claim 1, wherein the sputtering method consists of using the sputtering target in an atmosphere comprising at least water molecules and rare gas atoms.

10. The oxide semiconductor thin film according to claim 9, wherein the sputtering method consists of using the sputtering target in an atmosphere wherein the ratio of the water molecules contained in the mixed gas is 0.1% to 25% in terms of a partial pressure ratio.

11. The oxide semiconductor thin film according to claim 1, wherein the sputtering target does not comprise a bixbyite structure compound represented by $In_2O_3$.

12. The oxide semiconductor thin film according to claim 1, wherein the sputtering target has a bulk resistance of 5 mΩcm or less.

* * * * *